(12) United States Patent
Varadarajan

(10) Patent No.: US 11,708,634 B2
(45) Date of Patent: Jul. 25, 2023

(54) FILMS OF DESIRED COMPOSITION AND FILM PROPERTIES

(71) Applicant: Novellus Systems, Inc., Fremont, CA (US)

(72) Inventor: Bhadri N. Varadarajan, Beaverton, OR (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

(21) Appl. No.: 17/704,582

(22) Filed: Mar. 25, 2022

(65) Prior Publication Data

US 2022/0220610 A1 Jul. 14, 2022

Related U.S. Application Data

(60) Continuation of application No. 17/644,051, filed on Dec. 13, 2021, which is a continuation of application
(Continued)

(51) Int. Cl.
*C23C 16/452* (2006.01)
*C23C 16/32* (2006.01)
(Continued)

(52) U.S. Cl.
CPC .......... *C23C 16/325* (2013.01); *C23C 16/452* (2013.01); *C23C 16/50* (2013.01);
(Continued)

(58) Field of Classification Search
CPC ......... H01L 21/02222; H01L 21/02274; H01L 21/02167; H01L 21/02216;
(Continued)

(56) References Cited

U.S. PATENT DOCUMENTS

| 4,532,150 A | 7/1985 | Endo et al. |
| 4,952,658 A | 8/1990 | Kalchauer et al. |

(Continued)

FOREIGN PATENT DOCUMENTS

| CN | 1609156 A | 4/2005 |
| CN | 1714168 A | 12/2005 |

(Continued)

OTHER PUBLICATIONS

Advisory Action dated Aug. 11, 2021, in U.S. Appl. No. 16/044,357.
(Continued)

*Primary Examiner* — Yuechuan Yu
(74) *Attorney, Agent, or Firm* — Weaver Austin Villeneuve & Sampson LLP

(57) ABSTRACT

Provided are methods and systems for providing silicon-containing films. The composition of the silicon-containing film can be controlled by the choice of the combination of precursors and the ratio of flow rates between the precursors. The silicon-containing films can be deposited on a substrate by flowing two different organo-silicon precursors to mix together in a reaction chamber. The organo-silicon precursors react with one or more radicals in a substantially low energy state to form the silicon-containing film. The one or more radicals can be formed in a remote plasma source.

27 Claims, 5 Drawing Sheets

Related U.S. Application Data

No. 16/556,145, filed on Aug. 29, 2019, which is a continuation of application No. 14/961,637, filed on Dec. 7, 2015, now Pat. No. 10,472,714, which is a division of application No. 13/907,699, filed on May 31, 2013, now Pat. No. 9,234,276.

(51) Int. Cl.
    *C23C 16/505*   (2006.01)
    *H01L 21/02*    (2006.01)
    *C23C 16/50*    (2006.01)
    *C23C 16/52*    (2006.01)

(52) U.S. Cl.
    CPC ............ *C23C 16/505* (2013.01); *C23C 16/52* (2013.01); *H01L 21/02126* (2013.01); *H01L 21/02167* (2013.01); *H01L 21/02216* (2013.01); *H01L 21/02222* (2013.01); *H01L 21/02274* (2013.01)

(58) Field of Classification Search
    CPC ............. H01L 21/02126; C23C 16/325; C23C 16/452; C23C 16/505; C23C 16/50; C23C 16/52
    See application file for complete search history.

(56) References Cited

U.S. PATENT DOCUMENTS

| | | |
|---|---|---|
| 5,122,431 A | 6/1992 | Kodama et al. |
| 5,447,816 A | 9/1995 | Kodama et al. |
| 5,518,572 A | 5/1996 | Kinoshita et al. |
| 5,567,243 A | 10/1996 | Foster et al. |
| 5,807,615 A | 9/1998 | Sindzingre et al. |
| 6,013,155 A | 1/2000 | McMILLIN et al. |
| 6,262,445 B1 | 7/2001 | Swanson et al. |
| 6,365,527 B1 | 4/2002 | Yang et al. |
| 6,383,299 B1 | 5/2002 | Yuda et al. |
| 6,395,150 B1 | 5/2002 | Van et al. |
| 6,447,186 B1 | 9/2002 | Oguchi et al. |
| 6,448,186 B1 | 9/2002 | Olson et al. |
| 6,576,345 B1 | 6/2003 | Van et al. |
| 6,624,064 B1 | 9/2003 | Sahin et al. |
| 6,713,390 B2 | 3/2004 | M'Saad et al. |
| 6,790,788 B2 | 9/2004 | Li et al. |
| 6,846,391 B1 | 1/2005 | Papasouliotis et al. |
| 6,846,745 B1 | 1/2005 | Papasouliotis et al. |
| 6,849,561 B1 | 2/2005 | Goundar |
| 6,851,384 B2 | 2/2005 | Yuda et al. |
| 6,890,850 B2 | 5/2005 | Lee et al. |
| 6,919,270 B2 | 7/2005 | Satoh et al. |
| 6,935,553 B2 | 8/2005 | Suga et al. |
| 6,949,450 B2 | 9/2005 | Chiang et al. |
| 6,991,959 B2 | 1/2006 | Goundar et al. |
| 7,163,896 B1 | 1/2007 | Zhu et al. |
| 7,256,139 B2 | 8/2007 | Moghadam et al. |
| 7,514,375 B1 | 4/2009 | Shanker et al. |
| 7,524,735 B1 | 4/2009 | Gauri et al. |
| 7,582,555 B1 | 9/2009 | Lang et al. |
| 7,622,400 B1 | 11/2009 | Fox et al. |
| 7,648,899 B1 | 1/2010 | Banerji et al. |
| 7,662,355 B2 | 2/2010 | Kamisako et al. |
| 7,695,765 B1 | 4/2010 | Fox et al. |
| 7,709,063 B2 | 5/2010 | Yuda et al. |
| 7,736,728 B2 | 6/2010 | Loboda et al. |
| 7,915,166 B1 | 3/2011 | Yu et al. |
| 8,021,992 B2 | 9/2011 | Liou et al. |
| 8,053,372 B1 | 11/2011 | Greer et al. |
| 8,084,339 B2 | 12/2011 | Antonelli et al. |
| 8,168,268 B2 | 5/2012 | Ovshinsky |
| 8,178,168 B2 | 5/2012 | O'Neill et al. |
| 8,217,513 B2 | 7/2012 | Antonelli et al. |
| 8,864,935 B2 | 10/2014 | Fair et al. |
| 8,916,022 B1 | 12/2014 | Caron |
| 8,927,442 B1 | 1/2015 | Angyal et al. |
| 9,234,276 B2 | 1/2016 | Varadarajan |
| 9,371,579 B2 | 6/2016 | Varadarajan et al. |
| 9,391,086 B1 | 7/2016 | Soda et al. |
| 9,591,738 B2 | 3/2017 | Qiu et al. |
| 9,837,270 B1 | 12/2017 | Varadarajan et al. |
| 10,002,787 B2 | 6/2018 | Yu et al. |
| 10,211,310 B2 | 2/2019 | Varadarajan |
| 10,297,442 B2 | 5/2019 | Varadarajan et al. |
| 10,325,773 B2 | 6/2019 | Varadarajan et al. |
| 10,472,714 B2 | 11/2019 | Varadarajan |
| 10,580,690 B2 | 3/2020 | Yu et al. |
| 10,832,904 B2 | 11/2020 | Varadarajan |
| 10,840,087 B2 | 11/2020 | Weimer et al. |
| 11,049,716 B2 | 6/2021 | Tang et al. |
| 11,264,234 B2 | 3/2022 | Varadarajan et al. |
| 2002/0000202 A1 | 1/2002 | Yuda et al. |
| 2002/0039625 A1 | 4/2002 | Powell et al. |
| 2002/0106891 A1 | 8/2002 | Kim et al. |
| 2002/0132101 A1 | 9/2002 | Fonash et al. |
| 2003/0008528 A1 | 1/2003 | Xia et al. |
| 2003/0036272 A1 | 2/2003 | Shamouilian et al. |
| 2003/0064154 A1 | 4/2003 | Laxman et al. |
| 2003/0113995 A1 | 6/2003 | Xia et al. |
| 2003/0139035 A1 | 7/2003 | Yim et al. |
| 2003/0154141 A1 | 8/2003 | Capazario et al. |
| 2003/0176030 A1 | 9/2003 | Tsuji et al. |
| 2003/0194496 A1 | 10/2003 | Xu et al. |
| 2003/0232504 A1 | 12/2003 | Eppler et al. |
| 2004/0050328 A1* | 3/2004 | Kumagai .......... C23C 16/45574 427/574 |
| 2004/0067308 A1 | 4/2004 | Zheng et al. |
| 2004/0084680 A1 | 5/2004 | Ruelke et al. |
| 2004/0089924 A1 | 5/2004 | Yuasa et al. |
| 2004/0115876 A1 | 6/2004 | Goundar et al. |
| 2004/0115954 A1 | 6/2004 | Todd |
| 2004/0121085 A1 | 6/2004 | Wang et al. |
| 2004/0161535 A1 | 8/2004 | Goundar et al. |
| 2004/0180557 A1 | 9/2004 | Park et al. |
| 2004/0194706 A1 | 10/2004 | Wang et al. |
| 2004/0232552 A1 | 11/2004 | Wang et al. |
| 2004/0253777 A1 | 12/2004 | Miyoshi et al. |
| 2005/0014315 A1* | 1/2005 | Yamamoto ........ H01L 21/02532 257/E21.415 |
| 2005/0100682 A1 | 5/2005 | Fukiage et al. |
| 2005/0130404 A1 | 6/2005 | Moghadam et al. |
| 2005/0202685 A1 | 9/2005 | Huang et al. |
| 2005/0211170 A1 | 9/2005 | Hanawa et al. |
| 2005/0230831 A1 | 10/2005 | Clevenger et al. |
| 2005/0255714 A1 | 11/2005 | Iyer et al. |
| 2005/0287790 A1 | 12/2005 | Owada et al. |
| 2005/0287811 A1 | 12/2005 | Inukai |
| 2006/0014384 A1 | 1/2006 | Lee et al. |
| 2006/0014399 A1 | 1/2006 | Joe |
| 2006/0046520 A1 | 3/2006 | Padhi et al. |
| 2006/0091559 A1 | 5/2006 | Nguyen et al. |
| 2006/0160376 A1 | 7/2006 | Padhi et al. |
| 2006/0216916 A1 | 9/2006 | Tsai et al. |
| 2006/0252273 A1 | 11/2006 | Lakshmanan et al. |
| 2006/0273319 A1 | 12/2006 | Dairiki et al. |
| 2007/0004204 A1 | 1/2007 | Fukazawa et al. |
| 2007/0141812 A1 | 6/2007 | Zagwijn et al. |
| 2007/0173071 A1 | 7/2007 | Afzali-Ardakani et al. |
| 2007/0190266 A1 | 8/2007 | Fu |
| 2007/0281496 A1 | 12/2007 | Ingle et al. |
| 2008/0064173 A1 | 3/2008 | Hung |
| 2008/0132087 A1 | 6/2008 | Xia et al. |
| 2008/0156264 A1 | 7/2008 | Fair et al. |
| 2008/0178805 A1 | 7/2008 | Paterson et al. |
| 2008/0217746 A1 | 9/2008 | Morita et al. |
| 2008/0233366 A1 | 9/2008 | Edelstein et al. |
| 2008/0277765 A1 | 11/2008 | Lane et al. |
| 2009/0017227 A1 | 1/2009 | Fu et al. |
| 2009/0017640 A1 | 1/2009 | Huh et al. |
| 2009/0042402 A1 | 2/2009 | Morioka |
| 2009/0082240 A1 | 3/2009 | Nukui et al. |
| 2009/0093132 A1 | 4/2009 | Xu et al. |
| 2009/0095334 A1 | 4/2009 | Huston |
| 2009/0218699 A1 | 9/2009 | Torres et al. |

(56) References Cited

U.S. PATENT DOCUMENTS

| | | |
|---|---|---|
| 2009/0258487 A1 | 10/2009 | Lin et al. |
| 2009/0264277 A1 | 10/2009 | Raj et al. |
| 2009/0325364 A1 | 12/2009 | Sasagawa et al. |
| 2010/0025370 A1 | 2/2010 | Dieguez-Campo et al. |
| 2010/0075077 A1 | 3/2010 | Bicker et al. |
| 2010/0081293 A1 | 4/2010 | Mallick et al. |
| 2010/0099264 A1* | 4/2010 | Elers ............ H01L 21/31122 257/E21.218 |
| 2010/0181654 A1 | 7/2010 | Fujiwara et al. |
| 2010/0207274 A1 | 8/2010 | Hayashi et al. |
| 2010/0224322 A1* | 9/2010 | Sui .................. H01J 37/32963 156/345.25 |
| 2010/0255667 A1 | 10/2010 | Seino et al. |
| 2010/0308463 A1 | 12/2010 | Yu et al. |
| 2010/0317198 A1 | 12/2010 | Antonelli et al. |
| 2011/0027957 A1 | 2/2011 | Berry |
| 2011/0045676 A1 | 2/2011 | Park et al. |
| 2011/0074044 A1 | 3/2011 | Lin et al. |
| 2011/0111533 A1 | 5/2011 | Varadarajan et al. |
| 2011/0114994 A1 | 5/2011 | Mandlik et al. |
| 2011/0117678 A1 | 5/2011 | Varadarajan et al. |
| 2011/0146568 A1 | 6/2011 | Haukka et al. |
| 2011/0180866 A1 | 7/2011 | Matsuda et al. |
| 2011/0193230 A1 | 8/2011 | Nogami et al. |
| 2011/0204492 A1 | 8/2011 | Xie et al. |
| 2011/0217844 A1 | 9/2011 | Satou |
| 2011/0236594 A1 | 9/2011 | Haverkamp et al. |
| 2011/0244694 A1 | 10/2011 | Antonelli et al. |
| 2011/0256726 A1 | 10/2011 | LaVOIE et al. |
| 2012/0009802 A1 | 1/2012 | LaVOIE et al. |
| 2012/0077349 A1 | 3/2012 | Li et al. |
| 2012/0080779 A1 | 4/2012 | Seamons et al. |
| 2012/0119283 A1 | 5/2012 | Lee et al. |
| 2012/0122302 A1 | 5/2012 | Weidman et al. |
| 2012/0142172 A1 | 6/2012 | Fox et al. |
| 2012/0149213 A1* | 6/2012 | Nittala ............. H01L 21/67207 257/E21.24 |
| 2012/0214318 A1 | 8/2012 | Fukazawa et al. |
| 2012/0282756 A1 | 11/2012 | Meng |
| 2012/0329287 A1 | 12/2012 | Gates et al. |
| 2013/0008378 A1 | 1/2013 | Antonelli et al. |
| 2013/0043514 A1 | 2/2013 | Grill et al. |
| 2013/0056818 A1 | 3/2013 | Iino et al. |
| 2013/0075455 A1 | 3/2013 | Shimizu |
| 2013/0084711 A1 | 4/2013 | Liang et al. |
| 2013/0119406 A1 | 5/2013 | Notsu et al. |
| 2013/0129940 A1 | 5/2013 | Xiao et al. |
| 2013/0183835 A1 | 7/2013 | Nguyen et al. |
| 2013/0217239 A1 | 8/2013 | Mallick et al. |
| 2013/0242493 A1 | 9/2013 | Shenoy et al. |
| 2013/0298942 A1 | 11/2013 | Ren et al. |
| 2013/0319290 A1 | 12/2013 | Xiao et al. |
| 2013/0330932 A1 | 12/2013 | Rangarajan et al. |
| 2013/0330935 A1 | 12/2013 | Varadarajan |
| 2014/0132466 A1 | 5/2014 | Inoue et al. |
| 2014/0134827 A1 | 5/2014 | Swaminathan et al. |
| 2014/0191365 A1 | 7/2014 | Barabash et al. |
| 2014/0197470 A1 | 7/2014 | Lee et al. |
| 2014/0264780 A1 | 9/2014 | Yim et al. |
| 2014/0264925 A1 | 9/2014 | Chen |
| 2014/0302690 A1 | 10/2014 | Underwood et al. |
| 2014/0356549 A1 | 12/2014 | Varadarajan |
| 2015/0016085 A1 | 1/2015 | Natsumeda et al. |
| 2015/0110968 A1 | 4/2015 | LaVOIE et al. |
| 2015/0118394 A1 | 4/2015 | Varadarajan et al. |
| 2015/0179466 A1 | 6/2015 | Takayama et al. |
| 2015/0214015 A1 | 7/2015 | Kikuchi et al. |
| 2015/0249007 A1 | 9/2015 | Xiao et al. |
| 2015/0303056 A1 | 10/2015 | Varadarajan et al. |
| 2015/0329965 A1 | 11/2015 | Gadgil et al. |
| 2016/0020089 A1 | 1/2016 | Thadani et al. |
| 2016/0090649 A1 | 3/2016 | Varadarajan |
| 2016/0268286 A1 | 9/2016 | Tamura |
| 2016/0276140 A1 | 9/2016 | Varadarajan et al. |
| 2016/0284615 A1 | 9/2016 | Kitajima et al. |
| 2016/0314964 A1 | 10/2016 | Tang et al. |
| 2016/0358804 A1 | 12/2016 | Kulshreshtha et al. |
| 2017/0140924 A1 | 5/2017 | Suzuki et al. |
| 2017/0365462 A1 | 12/2017 | Varadarajan |
| 2017/0372919 A1 | 12/2017 | Manna et al. |
| 2018/0033614 A1 | 2/2018 | Chandra et al. |
| 2018/0061636 A1 | 3/2018 | Li et al. |
| 2018/0096842 A1 | 4/2018 | Varadarajan et al. |
| 2018/0144977 A1 | 5/2018 | Yu et al. |
| 2018/0202042 A1 | 7/2018 | Fafard et al. |
| 2018/0240664 A9 | 8/2018 | Varadarajan et al. |
| 2018/0247858 A1 | 8/2018 | Nakaya et al. |
| 2018/0330939 A1 | 11/2018 | Pore |
| 2018/0330945 A1 | 11/2018 | Varadarajan et al. |
| 2018/0330985 A1 | 11/2018 | Yu et al. |
| 2018/0347035 A1 | 12/2018 | Weimer et al. |
| 2019/0181004 A1 | 6/2019 | Tang et al. |
| 2019/0259604 A1 | 8/2019 | Varadarajan et al. |
| 2019/0382885 A1 | 12/2019 | Varadarajan |
| 2020/0027725 A1 | 1/2020 | Weimer et al. |
| 2021/0391171 A1 | 12/2021 | Yuan et al. |
| 2022/0098727 A1 | 3/2022 | Varadarajan |
| 2022/0148875 A1 | 5/2022 | Varadarajan et al. |
| 2022/0220608 A1 | 7/2022 | Varadarajan |
| 2022/0220609 A1 | 7/2022 | Varadarajan |
| 2022/0220611 A1 | 7/2022 | Varadarajan |
| 2022/0238333 A1 | 7/2022 | Yuan et al. |
| 2022/0238334 A1 | 7/2022 | Yuan et al. |

FOREIGN PATENT DOCUMENTS

| | | |
|---|---|---|
| CN | 1735945 A | 2/2006 |
| CN | 101017834 A | 8/2007 |
| CN | 101065834 A | 10/2007 |
| CN | 102171796 A | 8/2011 |
| CN | 102187450 A | 9/2011 |
| CN | 102468283 A | 5/2012 |
| CN | 102468434 A | 5/2012 |
| CN | 102652353 A | 8/2012 |
| CN | 102892922 A | 1/2013 |
| CN | 103168344 A | 6/2013 |
| CN | 105185707 A | 12/2015 |
| CN | 106024673 A | 10/2016 |
| CN | 106067440 A | 11/2016 |
| CN | 107667187 A | 2/2018 |
| CN | 107833825 A | 3/2018 |
| CN | 108028179 A | 5/2018 |
| CN | 108140545 A | 6/2018 |
| CN | 108504996 A | 9/2018 |
| CN | 108603287 A | 9/2018 |
| CN | 109791871 A | 5/2019 |
| JP | 2004006332 A | 1/2004 |
| JP | 2005051096 A | 2/2005 |
| JP | 2007194639 A | 8/2007 |
| JP | 2013102174 A | 5/2013 |
| KR | 20020058594 A | 7/2002 |
| KR | 20040036551 A | 4/2004 |
| KR | 20040068586 A | 7/2004 |
| KR | 20050002525 A | 1/2005 |
| KR | 20080110967 A | 12/2008 |
| KR | 20090019865 A | 2/2009 |
| KR | 20090106112 A | 10/2009 |
| KR | 20110021743 A | 3/2011 |
| KR | 20110082125 A | 7/2011 |
| KR | 20110093251 A | 8/2011 |
| KR | 20110094205 A | 8/2011 |
| KR | 20110134521 A | 12/2011 |
| KR | 101122458 B1 | 2/2012 |
| KR | 20120053003 A | 5/2012 |
| KR | 20120053331 A | 5/2012 |
| KR | 20120060781 A | 6/2012 |
| KR | 20120132403 A | 12/2012 |
| KR | 20130032343 A | 4/2013 |
| KR | 20130062256 A | 6/2013 |
| KR | 101334640 B1 | 11/2013 |
| KR | 20130139188 A | 12/2013 |
| KR | 20140114047 A | 9/2014 |
| KR | 20150047439 A | 5/2015 |
| KR | 20160095631 A | 8/2016 |

(56) References Cited

FOREIGN PATENT DOCUMENTS

| KR | 20160097149 A | 8/2016 |
|---|---|---|
| KR | 20160125310 A | 10/2016 |
| KR | 20180099476 A | 9/2018 |
| TW | 261689 B | 11/1995 |
| TW | 476807 B | 2/2002 |
| TW | 200600984 A | 1/2006 |
| TW | 200903635 A | 1/2009 |
| TW | 201124553 A | 7/2011 |
| TW | 201214563 A | 4/2012 |
| TW | 201405659 A | 2/2014 |
| WO | WO-03052162 A1 | 6/2003 |
| WO | WO-2010132579 A2 | 11/2010 |
| WO | WO-2011011532 A2 | 1/2011 |
| WO | WO-2011109148 A2 | 9/2011 |
| WO | WO-2018063825 A1 | 4/2018 |

OTHER PUBLICATIONS

Benilan et al., (Oct. 4, 2011) "Optimization of microwave Hydrogen plasma discharges to mimic Lyman α(121.6 nm) solar irradiations," EPSC-DPS2011-1317, EPSC-DPJ Joint Meeting 2011, EPSC Abstracts, 6:2pp.
Bishop C., "Atomic Layer Deposition," Vacuum Deposition onto Webs, 2011, 2nd Edition, Chapter 19, pp. 331-336.
Bishop, C. "Vacuum Deposition onto Webs, Films and Foils," Elsevier (2011) 2nd Edition Chapter 19 p. 331 (Year: 2011).
Blaszczyk-Lezak I., et al., "Silicon Carbonitride Films Produced by Remote Hydrogen Microwave Plasma CVD Using a (Dimethylamino) Dimethylsilane Precursor," Chemical Vapor Deposition, 2005, vol. 11 (1), pp. 44-52.
Boo et al., (1999) "Growth of boron nitride thin films on silicon substrates using new organoboron precursors" Phys. Stat. sol. (a), vol. 176. Nov. 1999, pp. 705-710.
Chinese Fifth Office Action dated May 8, 2021 issued in Application No. CN 201610084166.5.
Chinese First Office Action dated Dec. 20, 2018 issued in Application No. CN 201710307116.3.
Chinese First Office Action dated Jan. 3, 2018 issued in Application No. CN 201610084166.5.
Chinese First Office Action dated Jun. 25, 2018 issued in Application No. CN 201610251266.2.
Chinese First Office Action dated Nov. 19, 2020 issued in Application No. CN 201710812595.4.
Chinese First Office Action dated Septembers, 2016 issued in Application No. CN 201410576747.1.
Chinese Fourth Office Action dated Mar. 1, 2021 issued in Application No. CN 201610084166.5.
Chinese Reexamination Decision dated Apr. 8, 2020 issued in Application No. 201610251266.2.
Chinese Second Office Action dated Jun. 3, 2019 issued in Application No. CN 201710307116.3.
Chinese Second Office Action dated May 6, 2021 issued in Application No. CN 201710812595.4.
Chinese Second Office Action dated Oct. 12, 2018 issued in Application No. CN 201610084166.5.
Chinese Second Office Action [Decision of Final Rejection] dated Jan. 25, 2019 issued in Application No. CN 201610251266.2.
Chinese Third Office Action dated Apr. 22, 2019 issued in Application No. CN 201610084166.5.
Chinese Third Office Action dated Dec. 9, 2019 issued in Application No. CN 201710307116.3.
CN Office Action dated Septembers, 2021, in application No. CN201710812595.4 with English translation.
Co-pending U.S. Appl. No. 17/586,505, filed Jan. 27, 2021.
"Development of Current Atomic Theory," Emission Spectrum of Hydrogen, [downloaded at http://chemed.chem.purdue.edu/genchem/topicreview/bp/ch6/bohr.html on Sep. 23, 2015], 7 pp.

"Dummies' Guide To Hydrogen," Molecular Hydrogen Foundation, MHF, [downloaded at http://www.molecularhydrogenfoundation.org/core-information/dummies-guide-to-hydrogen on Sep. 23, 2015], 2 pp.
Fozza et al., (Jan./Feb. 1998) "Vacuum ultraviolet to visible emission of some pure gases and their mixtures used for plasma processing," J. Vac. Sci. Technol. A, American Vacuum Society, 16(1):72-77.
Fozza et al., (Jul. 2000) "Vacuum ultraviolet to visible emission from hydrogen plasma: Effect of excitation frequency," Journal of Applied Physics, 88(1):20-33.
G.E. Coates et al., "Chapter Four: Organometallic compounds of elements of main groups IV and V," Principles of Organometallic Chemistry, (1968) pp. 121-122.
Grubbs et al. (May/Jun. 2006) "Attenuation of hydrogen radicals traveling under flowing gas conditions through tubes of different materials," J. Vac. Sci. Technol. A, 24(3):486-496.
Hatanaka et al., (2000) "Experiments and analyses of SiC thin film deposition from organo-silicon by a remote plasma method," Thin Solid Films, 368:287-291.
Hollander et al., (May 1994) "Vacuum ultraviolet emission from microwave plasmas of hydrogen and its mixtures with helium and oxygen," J. Vac. Sci. Technol. A, 12(3):879-882.
Huran, J., et al., (2004) "RBS study of amorphous silicon carbide films deposited by PECVD," Czechoslovak Journal of Physics, 54(Suppl. C):C1006-C1010.
International Preliminary Report on Patentability dated Apr. 29, 2021 (ISA/KR) issued in Application No. PCT/US2019/055671.
International Preliminary Report on Patentability dated Feb. 4, 2021 (ISA/KR) issued in Application No. PCT/US2019/042413.
International Preliminary Report on Patentability dated Feb. 4, 2021 (ISA/KR) issued in Application No. PCT/US2019/042812.
International Preliminary Report on Patentability dated Feb. 4, 2021 (ISA/KR) issued in PCT/US2019/042821.
International Search Report and Written Opinion dated Jan. 31, 2020 (ISA/KR) issued in Application No. PCT/US2019/055671.
International Search Report and Written Opinion dated Nov. 20, 2019 (ISA/KR) issued in PCT/US2019/042812.
International Search Report and Written Opinion dated Nov. 8, 2019 (ISA/KR) issued in PCT/US2019/042821.
International Search Report and Written Opinion dated Oct. 25, 2019 (ISA/KR) issued in Application No. PCT/US2019/042413.
Jones et al., (Nov. 30, 2001) "Silicon Containing Polymers: The Science and Technology of Their Synthesis and Applications," Springer, p. 705.
Korean Decision for Grant dated Aug. 1, 2020 issued in Application No. KR 2014-0066922.
Korean Decision for Grant of Patent dated Dec. 27, 2019 issued in Application No. KR 10-2013-0066728.
Korean Decision Grant of Patent for Application No. KR 10-2020-0143459 dated Jul. 20, 2021.
Korean First Office Action dated Aug. 26, 2021 issued in Application No. KR 10-2017-0115040.
Korean First Office Action dated Aug. 9, 2019 issued in Application No. KR 10-2013-0066728.
Korean First Office Action dated Jan. 18, 2021 issued in Application No. KR 10-2020-0143459.
Korean First Office Action dated May 9, 2020 issued in Application No. KR 2014-0066922.
Korean First Office Action for Application No. KR 10-2014-0144392, dated Jun. 1, 2021.
KR Office Action dated Dec. 7, 2021, in Application No. KR1020210140454 with English translation.
KR Office Action dated Feb. 11, 2022, in Application No. KR1020170115040 with English translation.
KR Office Action dated Jan. 6, 2022, in Application No. KR1020140144392 with English translation.
KR office action dated Nov. 25, 2021, in application No. KR20140144392.
KR office action dated Nov. 25, 2021, in application No. KR20197012042 with English translation.
Notice of Allowance dated Oct. 14, 2021 in U.S. Appl. No. 16/400,320.

(56) References Cited

OTHER PUBLICATIONS

PCT International Preliminary Report on Patentability dated Apr. 11, 2019 (ISA/KR) issued in PCT/US2017/051794.
PCT International Preliminary Report on Patentability (ISA/KR) dated Jun. 27, 2019 issued in PCT/US2017/064024.
PCT International Preliminary Report on Patentability (ISA/KR) dated Jun. 6, 2019 issued in PCT/US2017/062882.
PCT International Search Report and Written Opinion (ISA/KR) dated Dec. 26, 2017 issued in PCT/US2017/051794.
PCT International Search Report and Written Opinion (ISA/KR) dated Mar. 15, 2018 issued in PCT/US2017/062882.
PCT International Search Report and Written Opinion (ISA/KR) dated Mar. 19, 2018 issued in PCT/US2017/064024.
"Radical (chemistry)" From Wikipedia, the free encyclopedia, [downloaded at http://en.wikipedia.org/wiki/Radical_(chemistry) on Sep. 23, 2015), 11 pages.
Singapore Notice of Allowance & Supplemental Exam Report dated Nov. 30, 2017 issued in Application No. SG 10201402381U.
Singapore Notice of Eligibility for Grant dated Jan. 11, 2021 issued in Application No. SG 10201600832V.
Sota et al., (2010) "Influence of atomic bonds on electrical property of boron carbon nitride films synthesized by remote plasma-assisted chemical vapor deposition. Diamond & Related Materials" vol. 19, No. 12, Jun. 23, 2010, pp. 1441-1445.
Taiwan Notice of Allowance and Search Report dated Jun. 14, 2018 issued in Application No. TW 103136697.
Taiwan Notice of Allowance dated Jan. 8, 2019 issued in Application No. TW 107126975.
Taiwan Office Action dated Dec. 22, 2015 issued in Application No. TW 102120742.
Taiwan Office Action dated Nov. 6, 2017 issued in Application No. TW 103119100.
Taiwanes Third Office Action dated Aug. 21, 2019 issued in Application No. TW 107123391.
Taiwanese First Office Action dated Dec. 24, 2018 issued in Application No. TW 107123391.
Taiwanese First Office Action dated Jul. 31, 2019 issued in Application No. TW 105103396.
Taiwanese First Office Action dated May 13, 2021 issued in Application No. TW 106140423.
Taiwanese Second Office Action dated Apr. 18, 2019 issued in Application No. TW 107123391.
U.S. Office Action dated Oct. 15, 2021, in U.S. Appl. No. 16/044,371.
U.S. Office Action dated Oct. 25, 2021, in U.S. Appl. No. 16/044,357.
U.S. Advisory Action and Examiner Initiated Interview Summary dated Aug. 12, 2015 issued in U.S. Appl. No. 13/907,699.
U.S. Appl. No. 16/240,133, inventors Varadarajan et al., filed Jan. 4, 2019.
U.S. Appl. No. 17/644,051, inventors Varadarajan et al., filed Dec. 13, 2021.
U.S. Corrected Notice of Allowability dated Mar. 17, 2021 issued in U.S. Appl. No. 16/194,102.
U.S. Corrected Notice of Allowance dated Jan. 27, 2022 in U.S. Appl. No. 16/400,320.
U.S. Examiner's Answer to the Appeal brief [filed Apr. 28, 2017] before the Patent Trial and Appeal Board dated Sep. 25, 2017 issued in U.S. Appl. No. 13/494,836.
U.S. Examiner's Answer to the Appeal brief [filed May 19, 2017] before the Patent Trial and Appeal Board dated Sep. 22, 2017 issued in U.S. Appl. No. 14/616,435.
U.S. Final Office Aciton dated Mar. 5, 2019 issued in U.S. Appl. No. 15/169,530.
U.S. Final Office Action dated Apr. 10, 2020 issued in U.S. Appl. No. 15/169,530.
U.S. Final Office Action dated Aug. 21, 2014 issued in U.S. Appl. No. 13/494,836.
U.S. Final Office Action dated Aug. 28, 2018 issued in U.S. Appl. No. 14/961,637.
U.S. Final Office Action dated Aug. 6, 2019 issued in U.S. Appl. No. 15/696,045.
U.S. Final Office Action dated Aug. 7, 2020 issued in U.S. Appl. No. 16/194,102.
U.S. Final Office Action dated Dec. 12, 2019 issued in U.S. Appl. No. 16/041,153.
U.S. Final Office Action dated Feb. 22, 2017 issued in U.S. Appl. No. 14/616,435.
U.S. Final Office Action dated Jul. 11, 2016 issued in U.S. Appl. No. 13/494,836.
U.S. Final Office Action dated Jun. 7, 2021 issued in U.S. Appl. No. 16/044,357.
U.S. Final Office Action dated Mar. 10, 2016 issued in U.S. Appl. No. 14/616,435.
U.S. Final Office Action dated May 14, 2015 issued in U.S. Appl. No. 13/907,699.
U.S. Final Office Action dated May 16, 2018 issued in U.S. Appl. No. 14/692,627.
U.S. Final Office Action, dated May 19, 2017, issued in U.S. Appl. No. 14/692,627.
U.S. Final Office Action dated May 24, 2021 issued in U.S. Appl. No. 16/044,371.
U.S. Final Office Action dated Nov. 16, 2015 issued in U.S. Appl. No. 13/494,836.
U.S. Final Office Action dated Nov. 30, 2021 issued in U.S. Appl. No. 16/556,145.
U.S. Final Office Action dated Oct. 20, 2020 issued in U.S. Appl. No. 16/194,102.
U.S. Notice of Allowance dated Feb. 19, 2016 issued in U.S. Appl. No. 14/062,648.
U.S. Notice of Allowance dated Feb. 24, 2021 issued in U.S. Appl. No. 16/194,102.
U.S. Notice of Allowance dated Feb. 4, 2019 issued in U.S. Appl. No. 14/616,435.
U.S. Notice of Allowance dated Feb. 7, 2018 issued in U.S. Appl. No. 15/408,291.
U.S. Notice of Allowance dated Jan. 7, 2019 issued in U.S. Appl. No. 15/283,159.
U.S. Notice of Allowance dated Jul. 24, 2020 issued in U.S. Appl. No. 16/041,153.
U.S. Notice of Allowance dated Jul. 8, 2020 issued in U.S. Appl. No. 15/696,045.
U.S. Notice of Allowance dated Jun. 18, 2019 issued in U.S. Appl. No. 14/961,637.
U.S. Notice of Allowance dated Mar. 25, 2020 issued in U.S. Appl. No. 16/041,153.
U.S. Notice of Allowance dated Oct. 2, 2018 issued in U.S. Appl. No. 13/494,836.
U.S. Notice of Allowance dated Oct. 22, 2019 issued in U.S. Appl. No. 15/972,554.
U.S. Notice of Allowance dated Sep. 10, 2015 issued in U.S. Appl. No. 13/907,699.
U.S. Notice of Allowance dated Sep. 22, 2017 issued in U.S. Appl. No. 15/382,137.
U.S. Office Action dated Apr. 18, 2019 issued in U.S. Appl. No. 15/972,554.
U.S. Office Action dated Apr. 22, 2021 issued in U.S. Appl. No. 16/556,145.
U.S. Office Action dated Aug. 29, 2018 issued in U.S. Appl. No. 15/283,159.
U.S. Office Action dated Dec. 19, 2014 issued in U.S. Appl. No. 13/907,699.
U.S. Office Action dated Dec. 2, 2019 issued in U.S. Appl. No. 15/169,530.
U.S. Office Action dated Dec. 29, 2017 issued in U.S. Appl. No. 15/283,159.
U.S. Office Action dated Feb. 5, 2018 issued in U.S. Appl. No. 14/961,637.
U.S. Office Action dated Feb. 7, 2014 issued in U.S. Appl. No. 13/494,836.
U.S. Office Action dated Jan. 28, 2019 issued in U.S. Appl. No. 15/696,045.
U.S. Office Action dated Jan. 29, 2019 issued in U.S. Appl. No. 14/961,637.

(56) References Cited

OTHER PUBLICATIONS

U.S. Office Action dated Jan. 9, 2017 issued in U.S. Appl. No. 13/494,836.
U.S. Office Action dated Jul. 28, 2017 issued in U.S. Appl. No. 15/408,291.
U.S. Office Action dated Jul. 7, 2017 issued in U.S. Appl. No. 15/382,137.
U.S. Office Action dated Jul. 8, 2016 issued in U.S. Appl. No. 14/616,435.
U.S. Office Action dated Jul. 9, 2019 issued in U.S. Appl. No. 16/041,153.
U.S. Office Action dated Mar. 10, 2016 issued in U.S. Appl. No. 13/494,836.
U.S. Office Action dated Mar. 19, 2020 issued in U.S. Appl. No. 16/194,102.
U.S. Office Action dated Mar. 6, 2020 issued in U.S. Appl. No. 15/696,045.
U.S. Office Action dated May 5, 2015 issued in U.S. Appl. No. 13/494,836.
U.S. Office Action dated Nov. 16, 2018 issued in U.S. Appl. No. 15/169,530.
U.S. Office Action dated Nov. 2, 2015 issued in U.S. Appl. No. 14/616,435.
U.S. Office Action dated Nov. 8, 2017 issued in U.S. Appl. No. 14/692,627.
U.S. Office Action dated Sep. 12, 2016 issued in U.S. Appl. No. 14/692,627.
U.S. Office Action dated Sep. 15, 2015 issued in U.S. Appl. No. 14/062,648.
U.S. Office Action dated Sep. 2, 2020 issued in U.S. Appl. No. 16/044,357.
U.S. Office Action dated Sep. 2, 2020 issued in U.S. Appl. No. 16/044,371.
U.S. Office Action dated Sep. 2, 2020 issued in U.S. Appl. No. 16/400,320.
U.S. Appl. No. 17/704,572, inventors Varadarajan et al., filed Mar. 25, 2022.
U.S. Appl. No. 17/704,574, inventors Varadarajan et al., filed Mar. 25, 2022.
U.S. Appl. No. 17/704,585, inventors Varadarajan et al., filed Mar. 25, 2022.
Wrobel et al., (2010) "Reactivity of Organosilicon Precursors in Remote Hydrogen Microwave Plasma Chemical Vapor Deposition of Silicon Carbide and Silicon Carbonitride Thin-Film Coatings," Appl. Organometal. Chem., 24:201-207.
Wrobel A.M., et al., "Oligomerization and Polymerization Steps in Remote Plasma Chemical Vapor Deposition of Silicon-Carbon and Silica Films from Organosilicon Sources," Chemistry of Materials, 2001, vol. 13 (5), pp. 1884-1895.
Xu, Ying-Yu, et al., (1999) "Preparation of SiC Thin Film Using Organosilicon by Remote Plasma CVD Method," Mat. Res. Soc. Symp. Proc., 544:185-189.
CN Office Action dated Sep. 22, 2022, in Application No. CN201780086632.6 with English translation.
CN Office Action dated Jul. 20, 2022, in application No. CN201710812595.4 with English translation.
CN Office Action dated Mar. 29, 2022, in application No. CN201710812595.4 with English translation.
KR Office Action dated Aug. 5, 2022 in Application No. KR10-2021-7015119 With English translation.
KR Office Action dated Jun. 23, 2022 in Application No. KR10-2019-7019853 with english translation.
KR Office Action dated Sep. 20, 2022 in Application No. KR10-2021-7005461 with English translation.
KR Office Action dated Jul. 20, 2022 in Application No. KR10-2019-7017914 With English translation.
KR Office Action dated May 30, 2022, in Application No. KR10-2022-0042652 with English Translation.
KR Office Action dated Apr. 12, 2022, in Application No. KR1020197019853 with English translation.
KR Office Action dated Aug. 3, 2022 in Application No. KR10-2022-0017600 With English translation.
KR Office Action dated Aug. 5, 2022 in Application No. KR10-2022-7013124 with English translation.
KR Office Action dated Aug. 5, 2022 in Application No. KR10-2022-7013129 with English translation.
KR Office Action dated Aug. 31, 2022 in Application No. KR10-2016-0014278 with English translation.
KR Office Action dated Jun. 21, 2022, in Application No. KR10-2022-0029219 with English translation.
KR Office Action dated Jun. 21, 2022, in Application No. KR10-2022-0029223 with English translation.
KR Office Action dated Jun. 21, 2022, in Application No. KR10-2022-0029224 with English translation.
KR Office Action dated Jun. 30, 2022 in Application No. KR10-2022-0042654 With English translation.
KR Office Action dated May 3, 2022, in Application No. KR1020197012042 with English translation.
KR Office Action dated May 9, 2022 in KR Application No. KR10-2022-0017600 with English translation.
KR Office Action dated Oct. 12, 2022, in Application No. KR10-2022-0029219 with English translation.
U.S. Non-Final office Action dated Jul. 12, 2022 in U.S. Appl. No. 17/586,505.
U.S. Non-Final office Action dated Oct. 5, 2022 in U.S. Appl. No. 17/704,585.
U.S. Non-Final office Action dated Sep. 7, 2022 in U.S. Appl. No. 17/286,407.
U.S. Final office Action dated Apr. 12, 2022 in U.S. Appl. No. 16/044,371.
U.S. Final Office Action dated Apr. 15, 2022 in U.S. Appl. No. 16/044,357.
U.S. Non Final Office Action dated Aug. 15, 2022 in U.S. Appl. No. 17/704,572.
U.S. Non-Final office Action dated Aug. 29, 2022 in U.S. Appl. No. 17/704,574.
U.S. Non-Final office Action dated Jul. 29, 2022 in U.S. Appl. No. 17/658,937.
U.S. Non-Final office Action dated Jul. 22, 2022 in U.S. Appl. No. 17/658,935.
U.S. Restriction Requirement dated Jul. 7, 2022 in U.S. Appl. No. 17/704,585.
U.S. Restriction Requirement dated Apr. 15, 2022, in U.S. Appl. No. 17/586,505.
CN Office Action dated Dec. 2, 2022, in Application No. CN201710812595.4 with English translation.
CN Office Action dated Nov. 1, 2022 in Application No. CN20198058950 With English translation.
CN Office Action dated Nov. 17, 2022, in Application No. CN201780072499.9 with English translation.
CN Office Action dated Nov. 24, 2022 in Application No. CN201980049405.5 with English translation.
CN Office Action dated Nov. 25, 2022 in Application No. CN201980084273.X with English translation.
CN Office Action dated Nov. 29, 2022 in Application No. CN201780060918.7 with English translation.
International Search Report and Written Opinion dated Mar. 15, 2018 in Application No. PCT/US2017/062882.
KR Office Action dated Dec. 5, 2022 in Application No. KR10-2022-7032867 With English Translation.
KR Office Action dated Feb. 8, 2023, in Application No. KR10-2016-0048396 with English translation.
KR Office Action dated Feb. 27, 2023, in Application No. KR10-2019-7017914.
KR Office Action dated Jan. 27, 2023, in Application No. KR10-2021-7005461 with English translation.
KR Office Action dated Jan. 27, 2023 in Application No. KR10-2022-0042654 with English translation.
KR Office Action dated Nov. 18, 2022 in Application No. KR10-2021-7015119 with English Translation.
KR Office Action dated Nov. 18, 2022 in Application No. KR10-2022-7013124 with English translation.

(56) References Cited

OTHER PUBLICATIONS

KR Office Action dated Nov. 18, 2022 in Application No. KR10-2022-7013129 with English translation.
KR Office Action dated Oct. 26, 2022, in Application No. KR 10-2022-0029224 with English translation.
KR Office Action dated Oct. 28, 2022 in Application No. KR10-20217005460 with English translation.
U.S Advisory Action dated Jan. 12, 2023, in U.S. Appl. No. 17/658,935.
U.S Advisory Action dated Jan. 23, 2023 in U.S. Appl. No. 17/658,937.
U.S. Corrected Notice of Allowance dated May 18, 2018 in U.S. Appl. No. 15/408,291.
U.S. Examiner's Answer to Appeal Brief Before the Patent Trial and Appeal Board on Dec. 27, 2022 in U.S. Appl. No. 16/044,357.
U.S. Examiner's Answer to Appeal Brief Before the Patent Trial and Appeal Board on Dec. 27, 2022 in U.S. Appl. No. 16/044,371.
U.S. Final office Action dated Nov. 15, 2022 in U.S. Appl. No. 17/658,937.
U.S. Final office Action dated Oct. 25, 2022 in U.S. Appl. No. 17/586,505.
U.S. Final Office Action dated Dec. 23, 2022 in U.S. Appl. No. 17/704,574.
U.S. Final office Action dated Jan. 11, 2023 in U.S. Appl. No. 17/586,505.
U.S. Final office Action dated Jan. 12, 2023 in U.S. Appl. No. 17/286,407.
U.S. Final office Action dated Nov. 1, 2022 in U.S. Appl. No. 17/658,935.
U.S. Final Office Action dated Nov. 29, 2022 in U.S. Appl. No. 17/704,572.
U.S. Notice of Allowance dated Feb. 10, 2023 in U.S. Appl. No. 17/704,585.
U.S. Notice of Allowance dated Feb. 13, 2023 in U.S. Appl. No. 17/704,572.
U.S. Appl. No. 18/175,513, inventors Weimer et al., filed Feb. 27, 2023.

* cited by examiner

FILMS OF DESIRED COMPOSITION AND FILM PROPERTIES

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in their entireties and for all purposes.

INTRODUCTION

Field of the Invention

The present disclosure relates generally to the formation of silicon carbide class of films.

BACKGROUND

The silicon carbide (SiC) class of thin films has unique physical, chemical, electrical, and mechanical properties and is used in a variety of applications, particularly integrated circuit applications. Examples of SiC class of thin films include oxygen and/or nitrogen doped SiC, such as silicon oxycarbide (SiOC), silicon carbon nitride (SiCN), and silicon oxycarbonitride (SiOCN). The composition of the SiC class of thin films may affect the desired physical, chemical, electrical, and mechanical properties of the thin films.

SUMMARY OF THE INVENTION

This disclosure pertains to a method of depositing silicon carbide films. The silicon carbide films can be doped or undoped. The method of depositing the silicon carbide film includes providing a substrate and flowing a first organo-silicon precursor and a second organo-silicon precursor together onto the substrate. The first and the second organo-silicon precursors are different from each other. The method further includes introducing one or more radicals in a substantially low energy state from a source gas, where the radicals react with the first and the second organo-silicon precursors to deposit the silicon carbide film on the substrate. The composition of the doped or undoped silicon carbide film can be tuned according to the choice of the combination of precursors and the ratio of the flow rates of the precursors. In some embodiments, a nitrogen doped silicon carbide film can be formed by mixing at least two organo-silicon precursors that have different ratios of silicon-carbon bonds to silicon-nitrogen bonds. In some embodiments, an oxygen doped silicon carbide film can be formed by mixing at least two organo-silicon precursors that have different ratios of silicon-carbon bonds to silicon-oxygen bonds. In some embodiments, a nitrogen and oxygen doped silicon carbide film can be formed by mixing an organo-silicon precursor with silicon-oxygen bonds and another organo-silicon precursor with silicon-nitrogen bonds. In some embodiments, an undoped silicon carbide film can be formed by mixing at least two organo-silicon precursors that have different ratios of silicon-carbon bonds. In some embodiments, the silicon carbide film can have a varying concentration of oxygen and nitrogen between a lower surface and an upper surface of the film. In some embodiments, the radicals are introduced by exposing the source gas to a remote plasma. The radicals may be produced from a source gas selected from the group consisting of: hydrogen, nitrogen, ammonia, and an amine.

This disclosure also pertains to an apparatus, including a reaction chamber, a plasma source configured to generate a plasma outside the reaction chamber, one or more first gas inlets coupled to the reaction chamber, a second gas inlet coupled to the reaction chamber, and a controller. The controller can be configured with instructions for perform: (a) flowing a first organo-silicon precursor through the one or more first gas inlets into the reaction chamber; (b) flowing a second organo-silicon precursor through the one or more first gas inlets into the reaction chamber to mix with the first organo-silicon precursor, where the second organo-silicon precursor is different from the first organo-silicon precursor; (c) providing one or more radical species in a substantially low energy state from the plasma in the plasma source; and (d) flowing the one or more radical species through the second gas inlet into the reaction chamber to react with the first and the second organo-silicon precursors to form a silicon carbide film on the substrate. In some embodiments, the silicon carbide film is doped with nitrogen and/or oxygen. In some embodiments, the controller is configured to flow each of the first and the second organo-silicon precursors at flow rates having a ratio of between about 1:1 and about 2:1. In some embodiments, the first and the second organo-silicon precursors each have one or more silicon-hydrogen bonds and/or silicon-silicon bonds. The radicals may be produced from a source gas selected from the group consisting of: hydrogen, nitrogen, ammonia, and an amine.

These and other embodiments are described further below with reference to the figures.

DETAILED DESCRIPTION

Figure 1:
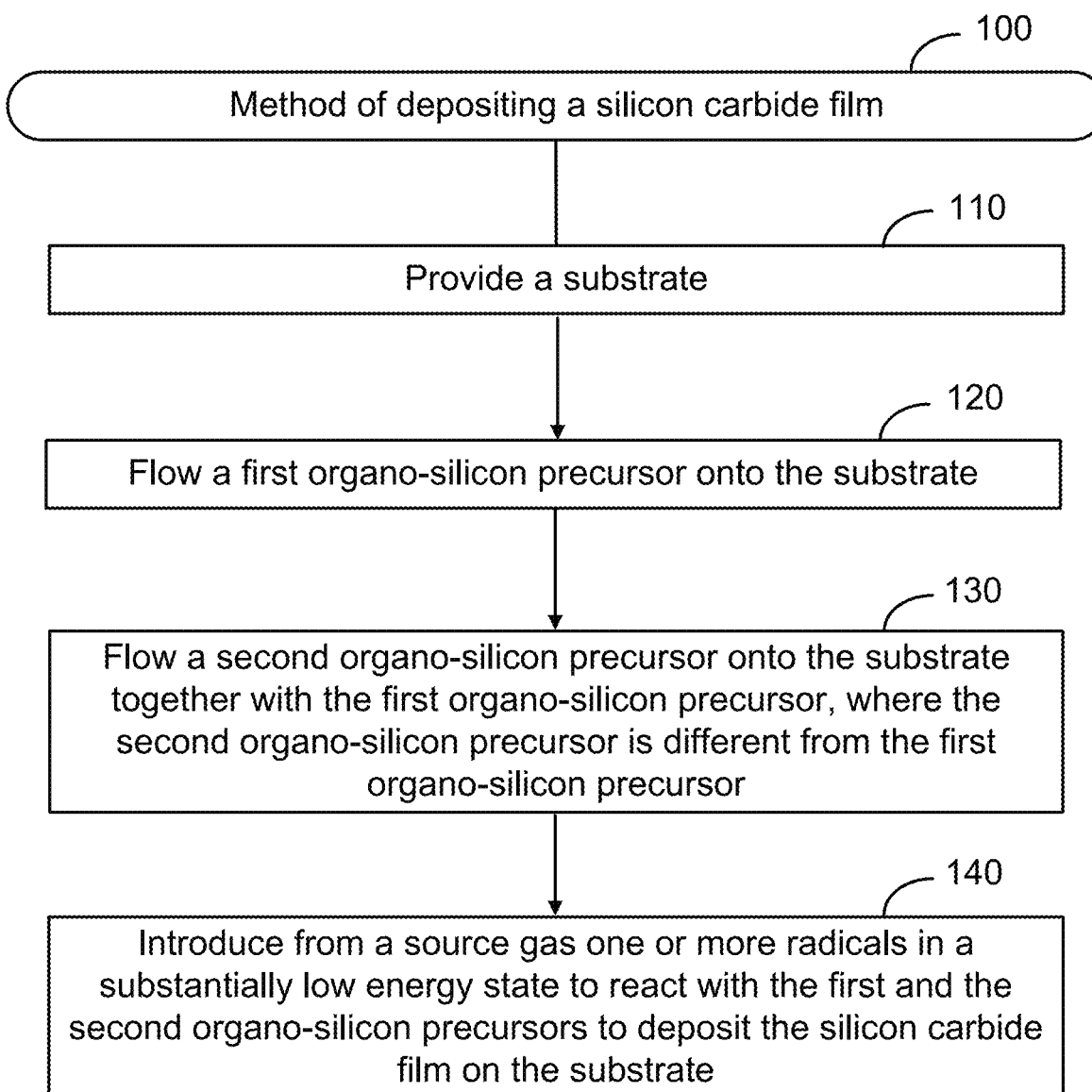
FIG. 1 shows an exemplary flow diagram illustrating a method of depositing a silicon carbide film.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

INTRODUCTION

Manufacture of semiconductor devices typically involves depositing one or more thin films on a substrate in an integrated fabrication process. In some aspects of the integrated fabrication process, classes of thin films such as SiC, SiCN, and SiOC can be deposited using atomic layer deposition (ALD), chemical vapor deposition (CVD), plasma-enhanced chemical vapor deposition (PECVD), or any other suitable deposition method.

PECVD processes may use in situ plasma processing for the deposition of silicon carbide classes of thin films, where the plasma processing occurs directly adjacent to a substrate. However, it has been found that depositing high-quality silicon carbide classes of thin films can have several challenges. For example, such challenges can include providing silicon carbide classes of thin films with excellent step coverage, low dielectric constants, high breakdown voltages, low leakage currents, low porosity, high hermeticity, high density, high hardness, and coverage over exposed metal surfaces without oxidizing the metal surfaces, among other things.

While this disclosure is not limited by any particular theory, it is believed that the plasma conditions in typical PECVD processes produce undesirable effects. For example, PECVD process may provide direct plasma conditions that break the Si—O, Si—N, and/or Si—C bonds in the precursor molecules. Direct plasma conditions can include charged particle bombardment and high-energy ultraviolet irradiation, which can result in damaging effects in the thin film.

One such film-damaging effect resulting from direct plasma conditions can include poor step coverage. The charged particles in direct plasma conditions can lead to highly reactive radicals with increased sticking coefficients. A deposited silicon carbide film may have silicon, carbon, oxygen, and/or nitrogen bonds that are "dangling," meaning that the silicon, carbon, oxygen, and/or nitrogen will have reactive unpaired valence electrons. The increased sticking coefficients of precursor molecules can lead to deposition of silicon carbide films with poor step coverage, as reactive precursor fragments may tend to stick to sidewalls of previously deposited films or layers.

Another film-damaging effect that may result from direct plasma conditions can include directionality in the deposition. This is due in part to the energy required to break up the precursor molecules can be at a low frequency, which creates a lot of ion bombardment at the surface. Directional deposition may further lead to deposition with poor step coverage.

Direct plasma conditions in PECVD may also lead to increased production of silicon-hydrogen bonding (Si—H) in the silicon carbide film. Specifically, broken bonds of Si—C can be replaced with Si—H. This can result in not only a reduced carbon content, but also result in films with poor electrical properties in some instances. For example, the presence of Si—H bonds can reduce breakdown voltages and increase leakage currents because the Si—H bonds provide a leakage path for electrons.

Furthermore, PECVD conditions typically include doping agents or co-reactants to control the doping of the silicon carbide material. Such doping agents can include carbon dioxide ($CO_2$), carbon monoxide (CO), water ($H_2O$), methanol ($CH_3OH$), oxygen ($O_2$), ozone ($O_3$), nitrogen ($N_2$), ammonia ($NH_3$), methane ($CH_4$), ethane ($C_2H_6$), acetylene ($C_2H_2$), and ethylene ($C_2H_4$). Fabrication of oxygen and/or nitrogen doped silicon carbide films generally require the use of such doping agents. For example, a silicon-containing precursor may be mixed with $NH_3$ to fabricate a nitrogen doped silicon carbide (SiCN) thin film, or a silicon-containing precursor may be mixed with $CO_2$ or $O_2$ to fabricate an oxygen doped silicon carbide (SiOC) thin film. Because typical PECVD conditions utilize such doping agents to dope silicon carbide classes of thin films, this results in a reduced amount of carbon content.

In PECVD processes, one way to control the composition of the silicon carbide film is by changing the structure or choice of the precursor itself. For example, the concentration of carbon, oxygen, and/or nitrogen in a silicon carbide film can be largely tied to the stoichiometry of the precursor molecule. Alternatively, another way to control the composition of the silicon carbide film is to alter the flow rates of the precursor and/or change the reactant gas species to control the composition of the silicon carbide film. For example, tetra methyl silane (4MS) may be flowed to react with $NH_3$ or $CO_2$ to form SiCN or SiOC, respectively. The flow rate of 4MS may be very low and the flow rate of $CO_2$ may be very high to form SiOC, where the amount of carbon content is low. The flow rate of 4MS may be very low and the flow rate of $NH_3$ may be very high to form SiCN, where the amount of carbon content is also low. In fact, it is energetically more favorable to form Si—O bonds or Si—N bonds over Si—C bonds, resulting in low carbon content in these films. Thus, the control of composition in silicon carbide films, such as the carbon content, may be limited to a narrow range. And as discussed earlier herein, the use of PECVD can undesirably lead to a very high number of Si—H bonds even if the silicon carbide film is undoped.

Moreover, where typical PECVD processes introduce oxidizing species, such as $O_2$, $O_3$, and $CO_2$, deposition of silicon carbide films with such oxidizing species can oxidize metal surfaces. For example, depositing silicon carbide films with oxidizing species over exposed copper surfaces can oxidize copper.

Method

Rather than using doping agents such as $NH_3$, $CO_2$, $O_2$, $O_3$, and the like to form doped silicon carbide films, the disclosed implementations described herein involve using radicals to react with an organo-silicon precursor to form doped or undoped silicon carbide thin films. In addition, the composition of the doped or undoped silicon carbide film can be controlled by flowing multiple organo-silicon precursors as co-reactants.

FIG. 1 shows an exemplary flow diagram illustrating a method of depositing a silicon carbide film. The process 100 begins at step 110, where a substrate is provided. The substrate can include any wafer, semiconductor wafer, partially fabricated integrated circuit, printed circuit board, or other appropriate work piece.

The process 100 continues at step 120, where a first organo-silicon precursor is flowed onto the substrate. In some implementations, the first organo-silicon precursor has one or more silicon-oxygen (Si—O) bonds and/or one or more silicon-nitrogen (Si—N) bonds. The organo-silicon precursor also has one or more silicon-carbon (Si—C) bonds and, in some implementations, one or more silicon-silicon (Si—Si) and/or silicon-hydrogen (Si—H) bonds. For a doped silicon carbide film, the carbon to nitrogen (C:N) ratio or the carbon to oxygen (C:O) ratio of the resulting doped silicon carbide film when reacting the first organo-silicon precursor with hydrogen radicals can substantially depend on the choice of the first organo-silicon precursor.

The process 100 continues at step 130, where a second organo-silicon precursor is flowed together with the first organo-silicon precursor. In some implementations, the second organo-silicon precursor has one or more Si—O bonds and/or one or more Si—N bonds. However, the second organo-silicon precursor is different from the first organosilicon precursor. Co-flowing at least two different organo-silicon precursors can achieve greater compositional control over the resulting silicon carbide film compared to reacting a single organo-silicon precursor with one or more doping agents. Reacting a single precursor may produce a limited range of C:N or C:O ratios that may be limited to the stoichiometry of the chosen precursor, flow rates of the precursor and doping agents, and choice of the doping agent.

Flowing the first organo-silicon precursor together with the second organo-silicon precursor can be achieved simultaneously or sequentially. Simultaneous flow enables the first and the second organo-silicon precursors to mix at the same time. Sequential flow enables the first and the second organo-silicon precursors to mix after the second organo-silicon precursor is delivered.

In some implementations, the first and the second organo-silicon precursors can be different combinations of organo-silicon oxide and organo-silicon nitride precursors. Specifically, an organo-silicon oxide precursor can combine with an organo-silicon nitride precursor to form a nitrogen and oxygen doped silicon carbide (SiOCN). An organo-silicon oxide precursor can combine with another organo-silicon oxide precursor to form oxygen doped silicon carbide (SiOC). An organo-silicon nitride precursor can combine with another organo-silicon nitride precursor to form nitrogen doped silicon carbide (SiCN).

To form SiOCN, the first organo-silicon precursor can have one or more Si—O bonds and the second organo-silicon precursor can have one or more Si—N bonds. To form SiOC, the first organo-silicon precursor and the second organo-silicon precursor can each have different ratios of Si—C bonds to Si—O bonds. To form SiCN, the first organo-silicon precursor and the second organo-silicon precursor can each have different ratios of Si—C bonds to Si—N bonds.

The process 100 continues at step 140, where one or more radicals are introduced from a source gas in a substantially low energy state to react with the first and the second organo-silicon precursors. The reaction leads to the deposition of a silicon carbide film on the substrate. The radicals are produced from a source gas, and the source gas can include hydrogen, nitrogen, ammonia, and/or an amine. In some instances, the radicals are substantially hydrogen radicals. The first and the second organo-silicon precursors react with the radicals so that the composition of the resulting silicon carbide film is largely tied to the flow rates and the choices of the first and the second organo-silicon precursors. In some implementations, the radicals are substantially ground state hydrogen radicals. In some implementations, the radicals are introduced by exposing the source gas to a remote plasma.

Environment at the Substrate Surface During Deposition

Figure 2A:
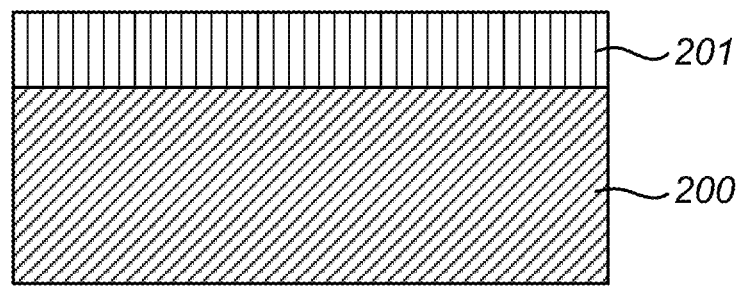
FIG. 2A shows a cross-section of an example of a silicon carbide film deposited over a substrate.
Figure 2B:
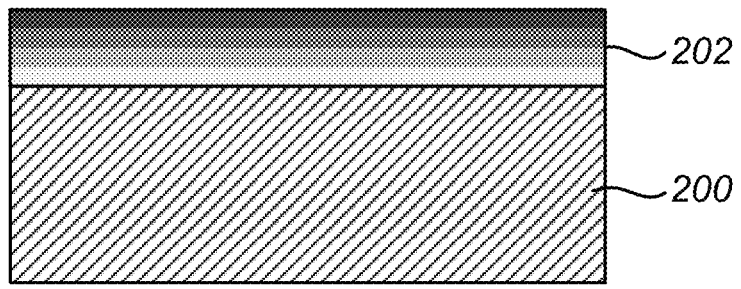
FIG. 2B shows a cross-section of an example of a graded doped silicon carbide film deposited over a substrate.

FIG. 2A shows a cross-section of an example of a silicon carbide film deposited over a substrate, which can be doped or undoped. As discussed earlier herein, the substrate 200 can include any wafer, semiconductor wafer, partially fabricated integrated circuit, printed circuit board, or other appropriate work piece. The silicon carbide film 201 can be formed under the appropriate process conditions and environments adjacent to the substrate 200. The silicon carbide film can include SiC, SiCN, SiOC, or SiOCN, meaning that any doped silicon carbide film is oxygen and/or nitrogen doped. The silicon carbide film 201 can be formed by flowing at least two different organo-silicon precursors together and that each react with radicals adjacent to the substrate 200. The chemical structures of exemplary organo-silicon precursors are discussed in further detail below.

The organo-silicon precursors can include one or more Si—O bonds and/or one or more Si—N bonds. In some implementations, the organo-silicon precursors can include one or more Si—H bonds and/or one or more Si—Si bonds. Without being limited by any theory, the process conditions for the radicals reacting with the organo-silicon precursors may include radicals having sufficient energy to break Si—H bonds or Si—Si bonds, but substantially preserve Si—O, Si—N, and/or Si—C bonds. As the Si—H and/or Si—Si bonds are broken, they can serve as reactive sites for forming bonds between the organo-silicon precursors in the silicon carbide film 201. The broken bonds can also serve as sites for cross-linking during thermal processing conducted during or after deposition. Bonding at the reactive sites and cross-linking can form a primary backbone or matrix collectively in the resulting silicon carbide film 201.

Generally, the described reaction conditions exist at the exposed face of the substrate 200 (the face where the silicon carbide film 201 is deposited). They may further exist at some distance above the substrate 200, e.g., about 0.5 microns to about 150 millimeters above the substrate 200. In effect, activation of the organo-silicon precursor can happen in the gas phase at a substantial distance above the substrate 200. Typically, the pertinent reaction conditions will be uniform or substantially uniform over the entire exposed face of the substrate 200, although certain applications may permit some variation.

The environment adjacent the substrate 200 can include one or more radical species, preferably in a substantially low energy state. While such radical species can include hydrogen atom radicals, other radical species may also be included or substituted with hydrogen atom radicals, such as elemental nitrogen radicals, ammonia radicals, and amine radicals. Examples of amine radicals include but are not limited to radicals of methylamine, dimethylamine, and aniline. In some embodiments, all or substantially all the radicals can be in the ground state, e.g., at least about 90% or 95% of the radicals adjacent the substrate 200 are in the ground state. In some embodiments, as discussed in further detail below, the radical species can be produced by a remote plasma source.

In some embodiments, the process conditions will have radical species in a substantially low energy state to break Si—H bonds and/or Si—Si bonds while substantially preserving Si—O, Si—N, and Si—C bonds. The process conditions will not have substantial amounts of ions, electrons, radical species in high energy states, such as states above the ground state, or ultraviolet (UV) radiation. In some embodiments, the concentration of ions in the region adjacent the film is no greater than about $10^7/cm^3$. The presence of substantial amounts of ions, UV, or high energy radicals may tend to break Si—O, Si—N, or Si—C bonds, which can produce films with undesirable electrical properties (e.g., high dielectric constants and/or low breakdown voltages) and poor conformality and uncontrolled composition. It is also believed that an excessively reactive environment produces reactive precursor fragments that can have high sticking coefficients (representing a propensity to chemically or physically stick to work piece sidewalls), and resulting in poor conformality.

However, it is understood that the process conditions adjacent to the substrate 200 may not necessarily break Si—H and/or Si—Si bonds to form the silicon carbide film 201. Si—H and/or Si—Si bonds may be absent from the chosen precursor molecules. In fact, the process conditions may also include ions, electrons, radical species in high energy states, or UV radiation to break other bonds, including Si—O, Si—N, or Si—C bonds, and form the silicon carbide film 201.

Without being limited by any theory, the reaction mechanism in forming the silicon carbide film 201 can occur through a series of activation, growth, and cross-linking steps. By way of example, dimethyl amino dimethyl silane (DMADMS) can undergo some of the following reaction mechanisms:

(Activation: 1a) Hydrogen radicals abstract hydrogen from DMADMS precursor molecule

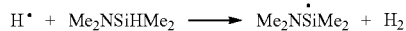

(Activation: 1b) Secondary gas phase reactions occur

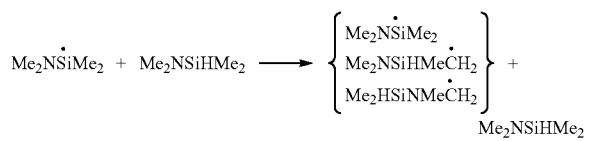

(Activation 1c) Activation also happens on a heated surface to form a highly reactive transient intermediate (silanimine)

(Growth step 2a) Recombination of radicals occur at the growth surface

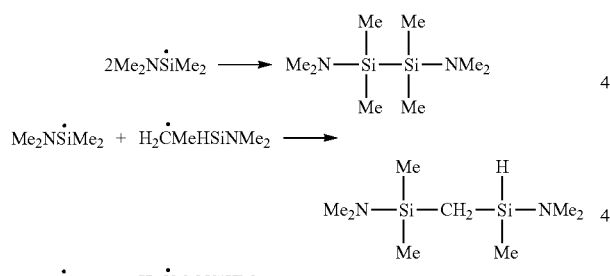

(Growth step 2b) Oligomers undergo surface reactions with radicals, resulting in hydrogen abstraction from methyl groups bonded to either silicon or nitrogen

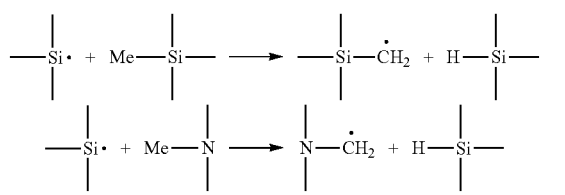

(Growth step 2c) Recombination occurs of thus formed radical sites with others on the surface or radicals arriving at the growth surface

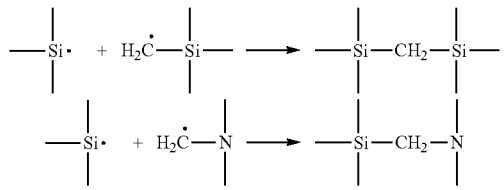

(Growth step 2d) Stepwise insertion of silanimine intermediate into Si—N polar units occurs

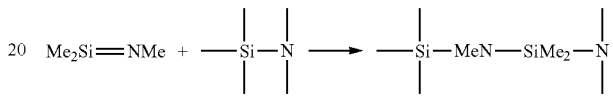

(Growth step 2e) Condensation of the dimethylaminosilane groups occurs (endothermic—happens at higher substrate temperatures)

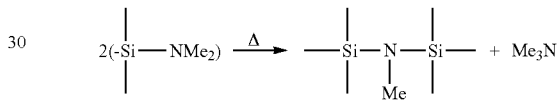

(Growth step 2f) Disilane units re-arrange to form carbosilane bonds

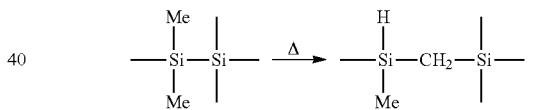

(Cross-linking step 3a) Transamination reactions result in Si—N network formation

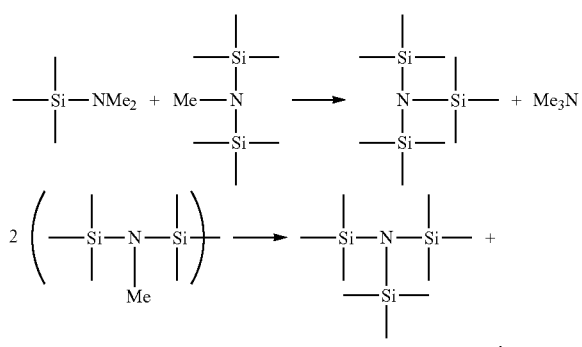

(Cross-linking step 3b) Methylsilyl groups also undergo thermally enhanced cross-linking

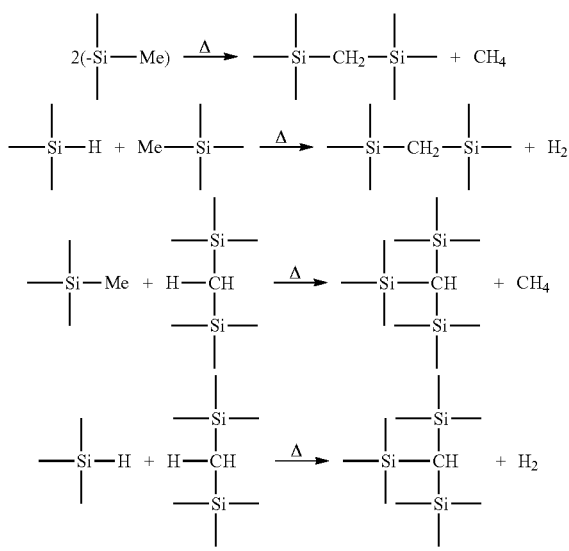

The organo-silicon precursors can be present in relative proportions with other species in the environment adjacent to the substrate 200. In particular, the organo-silicon precursors may be present with the radical species and other species, including other reactive species and/or carrier gases. In some embodiments, the organo-silicon precursors may be introduced in a mixture. Upstream from the deposition reaction surface, the organo-silicon precursors can be mixed with an inert carrier gas. Example inert carrier gases include, but are not limited to, nitrogen ($N_2$), argon (Ar), and helium (He).

The temperature in the environment adjacent to the substrate 200 can be any suitable temperature depending on the application of the device containing the silicon carbide film 201. The temperature in the environment adjacent to the substrate 200 can be largely controlled by the temperature of a pedestal on which a substrate 200 is supported during deposition of the silicon carbide film 201, for example. In some embodiments, the operating temperature can be between about 50° C. and about 500° C. For example, the operating temperature can be between about 250° C. and about 400° C., such as in many integrated circuit applications. In some embodiments, increasing the temperature can lead to increased cross-linking on the surface of the substrate 200.

The pressure in the environment adjacent to the substrate 200 can be any suitable pressure to produce reactive radicals in a process chamber. In some embodiments, the pressure can be about 35 Torr or lower. For example, the pressure can be between about 10 Torr and about 20 Torr, such as in embodiments implementing a microwave generated plasma. In other examples, the pressure can be less than about 5 Torr, or between about 0.2 Torr and about 5 Torr, such as in embodiments implementing a radio-frequency (RF) generated plasma. In some examples, the pressure can be between about 0.5 Torr and about 10 Torr, or between about 1.5 Torr and about 7 Torr.

The process conditions described earlier herein can provide a film structure that is highly conformal. The relatively mild process conditions can minimize the degree of ion bombardment at the surface of the substrate so that the deposition lacks directionality. Moreover, the relatively mild process conditions can reduce the number of radicals with high sticking coefficients that would have a tendency to stick to the sidewalls of previously deposited layers or films. In certain embodiments, for an aspect ratio of about 6:1 the silicon carbide film 201 can be deposited with a conformality of between about 25% and about 100%, and typically between about 50% and about 80%.

In some embodiments, a silicon carbide film 202 can have a graded or layered structure. It may be desirable in some instances to form a graded or layered silicon carbide film 202, where the composition of the silicon carbide film 202 changes as the thickness changes. Two different organo-silicon precursors can be flowed simultaneously at a time to, and then followed by one or more different organo-silicon precursors at a time $t_1$. Alternatively, one or more organo-silicon precursors can be flowed at a time $t_0$, and then followed by two different organo-silicon precursors at a time $t_1$. The organo-silicon precursors in each of these process flows can react with radicals, such as hydrogen radicals, to form different layers of silicon carbide films.

In one example, an initial portion of the deposition can use an organo-silicon nitride precursor to form a silicon carbide film 202 substantially comprising SiCN. This can be followed by deposition using a mixture of organo-silicon oxide and organo-silicon nitride precursors to substantially form SiOCN over SiCN in the silicon carbide film 202. In addition or in the alternative to depositing SiOCN over SiCN, the process can be followed by deposition using an organo-silicon oxide precursor to substantially form SiOC over the SiOCN and/or SiCN in the silicon carbide film 202. Thus, the combination of precursors can change at specific points in time to form the layered or graded silicon carbide film 202.

In another example, flow rates of the precursors can also change gradually to form the graded or layered silicon carbide films 202. Two different organo-silicon precursors can be flowed simultaneously having a given ratio of flow rates, and then changed gradually or instantaneously so that the precursors have another ratio of flow rates. By way of example, a mixture of an organo-silicon oxide precursor and an organo-silicon nitride precursor can be flowed simultaneously such that a ratio of flow rates between the two precursors is between about 1:1 and about 2:1. If the ratio of the flow rates between the organo-silicon oxide precursor and the organo-silicon nitride precursor is changed to be greater than about 2:1, then the resulting SiOCN film can have an increased concentration of oxygen relative to nitrogen as the thickness increases.

The layered or graded silicon carbide films 202 can have several applications. For example, SiOC films may be desirable as an etch stop or diffusion barrier layer over copper. However, SiOC films may exhibit poor adhesion over exposed copper surfaces. Thus, it may be desirable to initially deposit one or more layers of SiCN, which has greater adhesion on exposed copper surfaces, followed by deposition of one or more layers of SiOC.

Figure 2C:
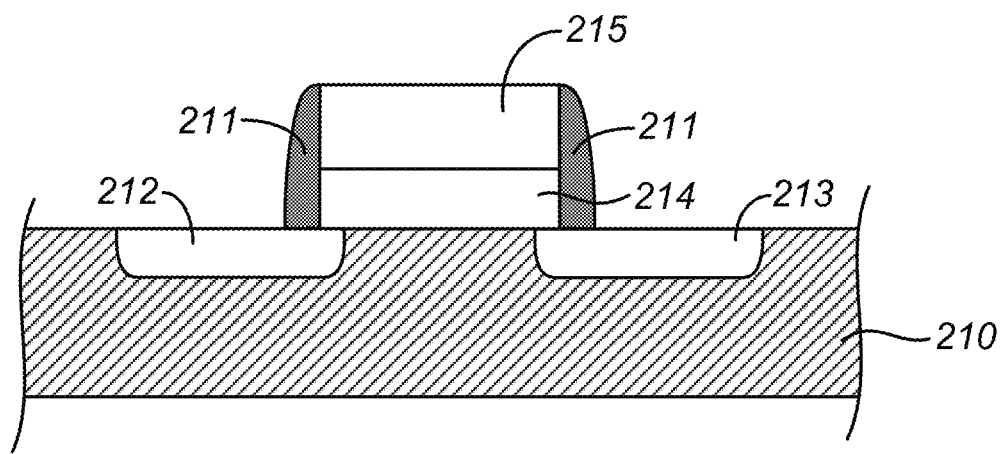
FIG. 2C shows silicon carbide vertical structures on the sidewalls of a gate electrode structure of a transistor.
Figure 2D:
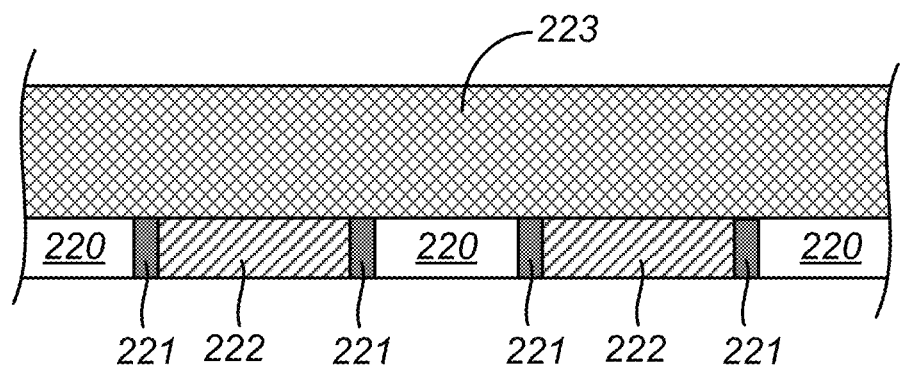
FIG. 2D shows silicon carbide vertical structures on exposed sidewalls of copper lines in an air gap type metallization layer.
Figure 2E:
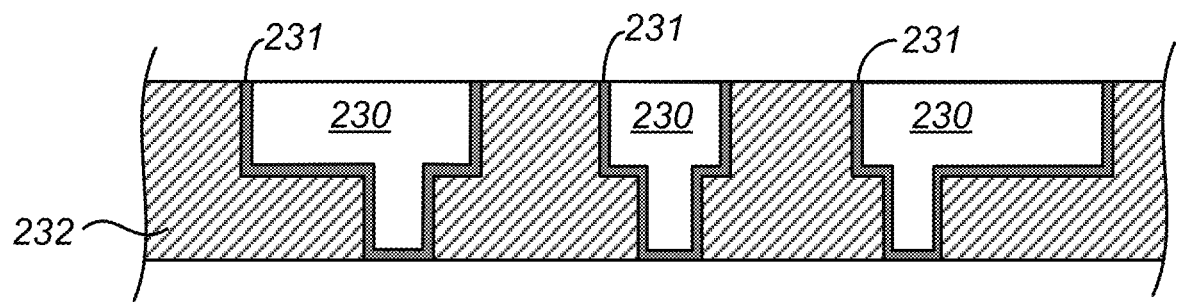
FIG. 2E shows silicon carbide pore sealants for porous dielectric materials.

FIGS. 2C-2E illustrate cross-sections of silicon carbide films in a variety of applications. However, it is understood that the silicon carbide films are not limited to these applications. FIG. 2C illustrates silicon carbide vertical structures on the sidewalls of a gate electrode structure of a transistor. FIG. 2D illustrates silicon carbide vertical structures on exposed sidewalls of copper lines in an air gap type metallization layer. FIG. 2E illustrates silicon carbide pore sealants for porous dielectric materials. Other applications include providing encapsulation during patterning for memory device applications, such as MRAM and RRAM device applications. Each of these applications is discussed in further detail below.

Chemical Structure of Precursors

As discussed earlier herein, the precursors employed in forming doped or undoped silicon carbide films can include organo-silicon precursors. In some embodiments, the organo-silicon precursors can include at least one Si—O bond and/or at least one Si—N bond. In some embodiments, the organo-silicon precursors also contain at least one Si—H bond and/or at least one Si—Si bond.

In some embodiments, the organo-silicon precursors may fall into one of several chemical classes. It is understood that any appropriate chemical classes of organo-silicon precursors may be employed and that the organo-silicon precursors are not limited to the chemical classes discussed below.

First, the organo-silicon precursor can be a siloxane. In some embodiments, the siloxane may be cyclic. Cyclic siloxanes may include cyclotetrasiloxanes, such as 2,4,6,8-tetramethylcyclotetrasiloxane (TMCTS), octamethylcyclotetrasiloxane (OMCTS), and heptamethylcyclotetrasiloxane (HMCTS). Other cyclic siloxanes can also include but are not limited to cyclotrisiloxanes and cyclopentasiloxanes. Embodiments using cyclic siloxanes are ring structures that can introduce porosity into a silicon carbide film, with the size of the pores corresponding to the radius of the ring. For example, a cyclotetrasiloxane ring can have a radius of about 6.7 Å.

Figure 3:
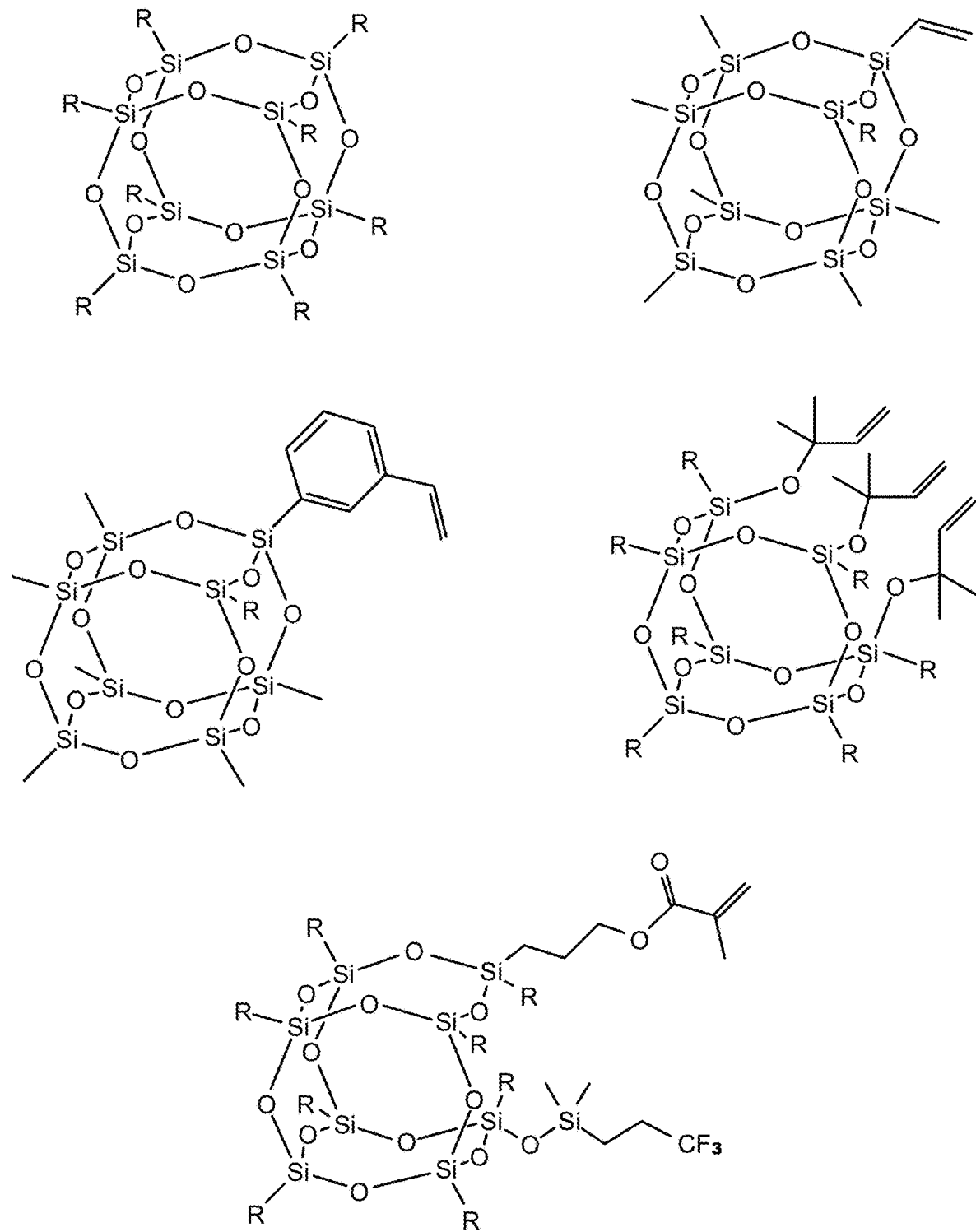
FIG. 3 shows examples of representative caged siloxane precursors.

In some embodiments, the siloxane may have a three-dimensional or caged structure. FIG. 3 shows examples of representative caged siloxane precursors. Caged siloxanes have silicon atoms bridged to one another via oxygen atoms to form a polyhedron or any 3-D structure. An example of a caged siloxane precursor molecule is silsesquioxane. Caged siloxane structures are described in further detail in commonly owned U.S. Pat. No. 6,576,345 to Cleemput et al., which is incorporated by reference herein in its entirety for all purposes. Like the cyclic siloxanes, the caged siloxane can introduce porosity into a silicon carbide film. In some embodiments, the porosity scale is mesoporous.

In some embodiments, the siloxane may be linear. Linear siloxanes may include but are not limited to disiloxanes, such as pentamethyldisiloxane (PMDSO) and tetramethyldisiloxane (TMDSO). PMDSO and TMDSO may be used to form SiOC films.

Second, the organo-silicon precursor can be an alkoxy silane. The alkoxy silanes include a central silicon atom with one or more alkoxy groups bonded to it and one or more hydrogen atoms bonded to it. Examples include but are not limited to trimethoxysilane (TMOS), dimethoxysilane (DMOS), methoxysilane (MOS), methyldimethoxysilane (MDMOS), diethoxymethylsilane (DEMS), dimethylethoxysilane (DMES), dimethylaminomethoxysilane (DMAMES), and dimethylmethoxysilane (DMMOS). Many of these precursors may be used to form SiOC films.

Third, the organo-silicon precursor can be an alkyl silane. The alkyl silanes include a central silicon atom with one or more alkyl groups bonded to it as well as one or more hydrogen atoms bonded to it. In certain embodiments, any one or more of the alkyl groups contain 1-5 carbon atoms. The alkyl groups may be saturated or unsaturated. Examples include but are not limited to tetramethylsilane (4MS), trimethylsilane (3MS), dimethylsilane (2MS), and triethylsilane (TES). In some embodiments, these alkyl groups may be used to SiC films.

Other types of alkyl silanes can include alkylcarbosilanes, alkylaminosilanes, and alkyldisilazanes. Alkylcarbosilanes can have a branched polymeric structure with a carbon bonded to a silicon atom as well as alkyl groups bonded to a silicon atom. Examples include dimethyl trimethylsilyl methane (DTMSM) and bis-dimethylsilyl ethane (BDMSE). Alkylaminosilanes include amines with alkyl groups and bonded to a silicon atom. Examples include dimethylamino dimethylsilane (DMADMS), bis-dimethylamino methylsilane (BDMAMS), and tris-dimethylamino silane (TDMAS). In some embodiments, these alkyl silanes can form SiCN films. Alkyldisilazanes include silazanes and alkyl groups bonded to two silicon atoms. An example includes 1,1,3,3-tetramethyldisilazane (TMDSN). In some embodiments, TMDSN can form SiCN films.

Additionally, disilanes, trisilanes, or other higher silanes may be used in place of monosilanes. An example of one such disilane from the alkyl silane class is hexamethyldisilane (HMDS). Another example of a disilane from the alkyl silane class can include pentamethyldisilane (PMDS), which can be used to form SiC films. In some embodiments, one of the silicon atoms can have a carbon-containing or alkoxy-containing group exclusively attached to it, and one of the silicon atoms can have a hydrogen atom exclusively attached to it.

In some embodiments, the precursor can include multiple chemical groups combined into a single precursor. For example, a single precursor can include alkoxy, amino, and alkyl groups, such as DMADMS.

In depositing the silicon carbide film, multiple organo-silicon precursors can be present in the process gas. For example, a siloxane and an alkyl silane may be used together, or a siloxane and an alkoxy silane may be used together. The relative proportions of the individual precursors can be chosen based on the chemical structures of precursors chosen and the application of the resulting silicon carbide film. For example, the amount of siloxane can be greater than the amount of silane in molar percentages to produce a porous film.

Composition of the Deposited Film

The deposited silicon carbide film may include relative proportions of silicon, carbon, oxygen, and nitrogen. The desired composition of the doped or undoped silicon carbide film can be achieved by: (1) choosing an appropriate combination of organo-silicon precursors and (2) adjusting the flows or the ratio of the flow rates of the organo-silicon precursors. By adjusting these parameters, it is possible to change the bulk composition of a silicon carbide film. In addition, it is possible to change the composition of a silicon carbide film with as the thickness changes.

The relative atomic concentrations of the silicon carbide film can vary depending on the choice of the combination of organo-silicon precursors. The choice of the organo-silicon precursor can directly affects the C:N ratio or the C:O ratio of a doped silicon carbide film. In addition, the choice of the organo-silicon precursor can directly affect the carbon concentration of a doped or undoped silicon carbide film. Because the stoichiometry of the organo-silicon precursor is indicative of the relative number of carbon and nitrogen atoms or the relative number of carbon and oxygen atoms in a precursor molecule, the choice of the organo-silicon precursor directly affects the C:N ratio or the C:O ratio of a resulting doped silicon carbide film. However, it is understood that the stoichiometric ratio of the precursor molecule may not be exactly the same as the C:N ratio or the C:O ratio of the doped silicon carbide film due to effects such as cross-linking. In other words, just because a precursor molecule has 5 atoms of carbon to 2 atoms of nitrogen does not necessarily equate to a C:N ratio of 2.5:1 in a nitrogen doped silicon carbide film.

By way of example, the DMADMS precursor molecule has a higher C:N ratio than the BDMAMS precursor molecule, and the BDMAMS precursor molecule has a higher C:N ratio than the TDMAS precursor molecule. Thus, using DMADMS gives a higher C:N ratio in a SiCN film than using BDMAMS, and using BDMAMS gives a higher C:N ratio in a SiCN film than using TDMAS.

The C:N or C:O ratio for a given precursor molecule can be discrete. As a result, the C:N ratio of a SiCN film or the C:O ratio of a SiOC film can be limited by the discrete ratios. Put another way, if DMADMS produces SiCN films having a C:N ratio of about 2.0, and if BDMAMS produces SiCN films having a C:N ratio of about 1.5, it may be challenging to produce a SiCN film having a C:N ratio between 1.5 and 2.0. In some embodiments, higher C:N or C:O ratios may be achieved by selecting precursors with more silicon atoms, including disilanes, trisilanes, and higher order silanes. However, tuning the composition precisely for a SiC class of films may be challenging without being limited to the discrete C:N ratio or C:O ratio for a given precursor molecule.

By flowing at least two different organo-silicon precursors simultaneously, silicon carbide films of varying compositions may be achieved. If a first organo-silicon precursor molecule has a discrete C:N or C:O ratio when flowed independently and a second organo-silicon precursor molecule has another discrete C:N or C:O ratio when flowed independently, the resulting C:N or C:O ratio when the two organo-silicon precursor molecules are flowed simultaneously can be between the discrete C:N or C:O ratios of the independently flowed precursor molecules. Taking from the example used earlier herein, flowing DMADMS and BDMAMS together can actually produce a SiCN film having a C:N ratio between about 1.5 and about 2.0.

Flowing at least two different organo-silicon precursors may not only produce silicon carbide films of varying compositions, but may also produce SiOCN films. Mixing organo-silicon precursors that are used for SiNC and SiOC films together enables deposition of SiOCN films. Therefore, co-flowing an organo-silicon nitride precursor, such as DMADMS, and an organo-silicon oxide precursor, such as DEMS, together can produce a SiOCN film.

Varying individual concentrations of silicon, carbon, nitrogen, and oxygen in SiCN, SiOC, and SiOCN films may not only be determined by the choice of the combination of the precursors, but may also be determined by the ratio of the precursor flow. For example, if the ratio of the flow rates between DMADMS and BDMAMS is about 1:1, and yields a given C:N ratio in a SiCN film, then increasing the ratio of the flow rates to greater than 1:1 can yield a greater C:N ratio in the SiCN film. In some embodiments, the ratio of the flow rates between a first organo-silicon precursor and a second organo-silicon precursor is between about 1:1 and about 2:1. In some embodiments, the ratio of the flow rates between a first organo-silicon precursor and a second organo-silicon precursor is greater than about 2:1. Thus, the composition of a silicon carbide film can be tuned according to the ratio of the flow rates of two different organo-silicon precursors.

In some embodiments, the composition of the silicon carbide film can be layered or graded. In other words, the silicon carbide film can have a varying concentration of nitrogen and oxygen between a lower surface and an upper surface of the film. In some instances, the choice of the precursor combinations can change at a given point in time. For example, deposition of SiCN may occur initially by flowing DMADMS independently, followed by deposition of SiOCN by flowing DMADMS and DEMS simultaneously. In other instances, the ratio of the flow rates between the precursors can change gradually or at any given point in time. For example, deposition of varying concentrations of SiOCN may occur by initially flowing TDMAS and DEMS simultaneously and having a ratio of flow rates between TDMAS and DEMS of about 2:1, followed by gradually or instantaneously changing the ratio of flow rates to be about 1:2. This can result in a SiOCN film having a high concentration of nitrogen and a low concentration of oxygen at a lower surface of the film, and a low concentration of nitrogen and a high concentration of oxygen at an upper surface of the film.

By mixing the appropriate combination of precursors with the appropriate ratio of flow rates, a desired composition of a silicon carbide film can be achieved. The desired composition of the silicon carbide film can be related to the desired application of the film. Tuning the individual concentrations of silicon, carbon, nitrogen, and oxygen can yield film structures with a desired breakdown voltage, leakage current, dielectric constant, hermeticity, density, adhesion to metal surfaces such as copper, stress, modulus, and hardness, among other properties. In addition, tuning the individual concentrations of silicon, carbon, nitrogen, and oxygen can yield film structures with desired etch rates, resistance to oxidation for underlying films during subsequent processing, resistance to high temperature annealing operations or rapid thermal processing, and desired impact of UV radiation during UV curing of ultra low-k dielectrics.

For example, a silicon carbide film can have reduced leakage currents by reducing carbon content or increasing oxygen or nitrogen content. By introducing oxygen or nitrogen into a silicon carbide class of material, leakage paths provided by Si—H bonds and/or Si—$CH_2$—Si bonds may be blocked. Alternatively, by reducing carbon content, fewer leakage paths provided by Si—$CH_2$—Si bonds are available. This can lead to improved electrical properties while maintaining a relatively low dielectric constant.

Moreover, a silicon carbide film can have a lower dielectric constant with reduced carbon content. A deposited film that contains an increased number of Si—N bonds or Si—O bonds than Si—C bonds can lower the effective dielectric constant of the film. However, it is understood that in some instances, a higher concentration of carbon can result in a lower effective dielectric constant (e.g., adding carbon to silicon oxide or silicon nitride), especially in PECVD methods. The amount of cross-linking with Si—O and Si—N is reduced, polarity is reduced, and density is reduced due to terminal methyl groups. Nevertheless, typically a pure silicon carbide film has a high effective dielectric constant, due at least in part to increased cross-linking and density. Generally, silicon carbide films produced using the methods described herein fall into this category, where a high carbon concentration leads to a higher effective dielectric constants due to increased cross-linking and density. Hence, a higher C:N or a higher C:O ratio results in a higher dielectric constant. For example, silicon carbide films produced using DMADMS have a higher C:N ratio that results in a higher dielectric constant than BDMAMS.

In some embodiments, the internal structure of the organo-silicon precursor is maintained in the deposited film. This structure may preserve all or most of the Si—C, Si—O, and Si—N bonds in the precursor, while linking or cross-linking individual precursor moieties through bonds at locations where Si—H bonds and/or Si—Si bonds existed in the precursor molecules and/or through additional condensation reactions on the growing surface if sufficient thermal energy is provided. In various embodiments, the silicon carbide film has an effective dielectric constant of about 4.0 or lower, and in some cases about 3.5 or lower, and in some cases about 3.0 or lower, and in still other implementations about 2.5 or lower. The effective dielectric constant can depend on the bonding and density.

In some embodiments, it may be desirable to tune the dielectric constant of the silicon carbide film. By selecting an appropriate precursor to produce certain C:N or C:O ratios, the effective dielectric constant may be adjusted. In some embodiments, the dielectric constant of the silicon carbide film may be between about 8.5 and about 2.5.

In some embodiments, the silicon carbide film can also serve as a hermetic or diffusion barrier. When the density of the silicon carbide film is increased, the hermeticity and diffusion barrier properties of the silicon carbide film are improved. Increasing the density can be achieved by increasing the amount of cross-linking. By introducing a slight amount of oxygen and/or nitrogen into a silicon carbide film, cross-linking increases to improve hermeticity and diffusion barrier properties. Thus, precursors with a relatively high C:N or C:O ratios can improve hermeticity and diffusion barrier properties.

In some embodiments, the deposited film can be porous. As discussed earlier herein, the organo-silicon precursors can include cyclic siloxanes and caged siloxanes. Thus, the cyclic siloxanes and caged siloxanes can introduce porosity into the structure of the deposited film. Porosity in the deposited film can further lower the dielectric constant. In some embodiments, the porosity of the silicon carbide film is between about 20% and 50%. The pore size of porous film may track with that of the selected cyclic or caged precursor. In certain embodiments, the film's average pore size is between about 5 Å and 20 Å, such as about 16 Å.

Apparatus

One aspect of the disclosure is an apparatus configured to accomplish the methods described herein. A suitable apparatus includes hardware for accomplishing the process operations and a system controller having instructions for controlling process operations in accordance with the present disclosure. In some embodiments, the apparatus for performing the aforementioned process operations can include a remote plasma source. A remote plasma source may minimize the harsh reaction conditions otherwise caused by a direct plasma.

Figure 4:
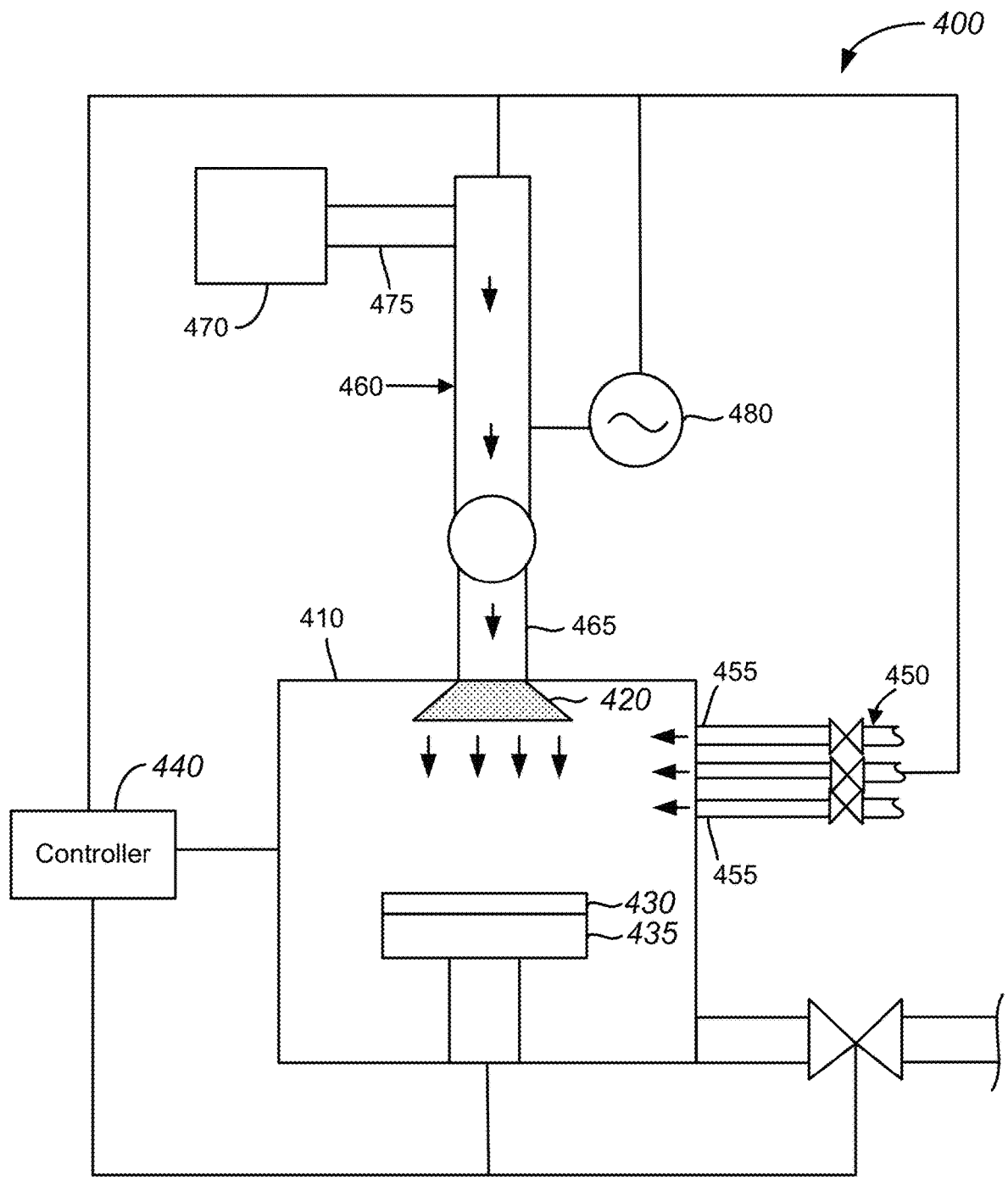
FIG. 4 shows a schematic view of a processing apparatus with a remote plasma source.

FIG. 4 illustrates a schematic diagram of a remote plasma apparatus according to certain embodiments. The apparatus 400 includes a reaction chamber 410, a remote plasma source 460, a precursor gas delivery source 450, and a showerhead assembly 420. Inside the reaction chamber 410, a substrate 430 rests on a stage or pedestal 435. In some embodiments, the pedestal 435 can be fitted with a heating/cooling element. A controller 440 may be connected to the components of the apparatus 400 to control the operation of the apparatus 400. For example, the controller 440 may contain instructions for controlling process conditions for the operations of the apparatus 400, such as the temperature process conditions and/or the pressure process conditions.

During operation, gases or gas mixtures are introduced into the reaction chamber 410 via one or more gas inlets coupled to the reaction chamber 410. In some embodiments, a plurality of gas inlets is coupled to the reaction chamber 410. A precursor gas delivery source 450 may include a plurality of first gas inlets 455 coupled to the reaction chamber 410 for the delivery of precursor gases. Each of the plurality of first gas inlets 455 may enable multiple precursor gases to be co-flowed together into the reaction chamber 410, which can occur simultaneously or sequentially. A second gas inlet 465 may be coupled to the reaction chamber 410 via the showerhead assembly 420 and connected to a remote plasma source 460. The second gas inlet 465 may be connected to the showerhead assembly 420 for the delivery of radical species. The second gas inlet 465 may be connected to a vessel 470 which provides a source gas for the radical species. In embodiments including remote plasma configurations, the delivery lines for the precursors and the radical species generated in the remote plasma source 460 are separated. Hence, the precursors and the radical species do not substantially interact before reaching the substrate 430.

One or more radical species may be generated in the remote plasma source 460 and configured to enter the reaction chamber 410 via the second gas inlet 465. Any type of plasma source may be used in the remote plasma source 460 to create the radical species. This includes, but is not limited to, capacitively coupled plasmas, microwave plasmas, DC plasmas, inductively coupled plasmas, and laser-created plasmas. An example of a capacitively coupled plasma can be a radio-frequency (RF) plasma. A high-frequency plasma can be configured to operate at 13.56 MHz or higher. An example of such a remote plasma source 460 can be the GAMMA®, manufactured by Lam Research Corporation of Fremont, Calif. Another example of such a RF remote plasma source 460 can be the Aston®, manufactured by MKS Instruments of Wilmington, Mass., which can be operated at 440 kHz and can be provided as a subunit bolted onto a larger apparatus for processing one or more substrates in parallel. In some embodiments, a microwave plasma can be used as the remote plasma source 460, such as the Astex®, also manufactured by MKS Instruments. A microwave plasma can be configured to operate at a frequency of 2.45 GHz.

The remote plasma source 460 may include a plasma dome or other shape to form a volume for delivering the source gas from the vessel 450. Examples of remote plasma sources may be described in U.S. Pat. No. 8,084,339 (attorney docket no.: NOVLP414), U.S. Pat. No. 8,217,513 (attorney docket no.: NOVLP414D1), U.S. patent application Ser. No. 12/533,960 (attorney docket no.: NOVLP414X1), U.S. patent application Ser. No. 11/616,324 (attorney docket no.: NOVLP445), U.S. patent application Ser. No. 13/493,655 (attorney docket no.: NOVLP445C1), U.S. patent application Ser. No. 12/062,052 (attorney docket no.: NOVLP447), and U.S. patent application Ser. No. 12/209,526 (attorney docket no.: NOVLP448), each of which is incorporated herein by reference in its entirety for all purposes. In some embodiments, the remote plasma source 460 may include an inlet 475 connected to the vessel 470 with a plurality of holes configured to distribute the source gas into the internal volume of the remote plasma source 460.

When the source gas enters the remote plasma source 460, a plasma may be generated using the radio-frequency (RF) coils (not shown), which may be connected to an RF source 480 via a matching network. The plasma may generate radical species, such as hydrogen radicals, from a hydrogen source gas that flows towards the showerhead assembly 420. The radical species may flow through a plurality of holes in the showerhead assembly 420 from the second gas inlet 465 to distribute the radical species into the reaction chamber 410. At the same time, precursor gases may be distributed from the first gas inlets 455 into the reaction chamber 410 to mix with the radical species. The precursor gases may be flowed into the reaction chamber 410 at a controlled flow rate. Reactions with the precursor gases and the radical species may take place in the reaction chamber 410 above and adjacent to the substrate 430.

The radical species formed in the remote plasma source 460 is carried in the gas phase into the reaction chamber 410 toward the substrate 430. The remote plasma source 460 may be substantially perpendicular to the substrate 430 so as to direct the radical species in a substantially transverse direction to the surface of the substrate 430 from the showerhead assembly 420. It is understood, however, that the remote plasma source 460 may be oriented in any number of directions relative to the surface of the substrate 430. The distance between the remote plasma source 460 and the substrate 430 can be configured to provide mild reactive conditions such that the ionized species generated in the remote plasma source 460 are substantially neutralized, but at least some radical species in substantially low energy states remain in the environment adjacent to the substrate 430. Such low energy state radical species are not recombined to form stable compounds. The distance between the remote plasma source 460 and the substrate 430 can be a function of the aggressiveness of the plasma (e.g., adjusting the RF power level), the density of gas in the plasma (e.g., if there's a high concentration of hydrogen atoms, a significant fraction of them may recombine to form $H_2$ before reaching the reaction chamber 410), and other factors. In some embodiments, the distance between the remote plasma source 460 and the reaction chamber 410 can be greater than about 10 cm, such as between about 10 cm and 50 cm. Also, for some of the same or similar reasons, the distance between the showerhead assembly 420 and the first gas inlets 455 may be greater than about 5 cm, such as between about 5 cm and about 20 cm.

The controller 440 may contain instructions for controlling process conditions and operations in accordance with the present invention for the apparatus 400. The controller 440 will typically include one or more memory devices and one or more processors. The processor may include a CPU or computer, analog and/or digital input/output connections, stepper motor controller boards, etc. Instructions for implementing appropriate control operations are executed on the processor. These instructions may be stored on the memory devices associated with the controller 440 or they may be provided over a network. Machine-readable media containing instructions for controlling process operations in accordance with the present invention may be communicatively coupled to the controller 440.

In certain embodiments, the controller 440 controls all or most activities of the semiconductor processing apparatus 400 described herein. The controller 440 may be configured, for example, to control the gas flows of the precursor gases into the reaction chamber 410. The controller 440 may also control the RF source 480 to power the RF coils. The controller 440 may also control the flow rate of the coolant or the temperature of the cooling/heating element for the pedestal 435. The controller 440 may control all or most activities of the semiconductor processing apparatus 400 associated with depositing protective layers and removing sacrificial materials. The controller 440 may execute system control software that include sets of instructions for controlling the timing, gas composition, gas density, flow rates, chamber pressure, chamber temperature, RF power levels, substrate position, and/or other parameters. Other computer programs, scripts, or routines stored on memory devices associated with the controller 440 may be employed in some embodiments. To provide relatively mild reactive conditions at the environment adjacent to the substrate 430, parameters such as the RF power levels, gas density, and timing of the plasma can be adjusted by controller 440. Additionally, adjusting the substrate position may further reduce the presence of high-energy radical species at the environment adjacent to the substrate 430.

The process conditions and the process flow itself can be controlled by the controller 440 which comprises program instructions for monitoring, maintaining and/or adjusting certain process variables. For example, instructions specifying flow rates or a ratio of flow rates may be included. Instructions may also include parameters for pre-clean, passivation, protective layer formation, non-protective layer, pinning operations, other post-deposition treatments, etching, partial filling, and the like. The controller 440 may comprise different or identical instructions for different apparatus stations, thus allowing the apparatus stations to operate either independently or synchronously.

In some embodiments, the controller 440 may include instructions for performing operations such as flowing two or more organo-silicon precursors through the first gas inlets 455 into the reaction chamber 410 together to mix, providing radical species in a substantially low energy state in the remote plasma source 460, and flowing the radical species through the second gas inlet 465 into the reaction chamber 410 to react with the two or more organo-silicon precursors to form the silicon carbide film on the substrate 430.

In some embodiments, there may be a user interface associated with controller 440. The user interface may include a display screen, graphical software displays of the apparatus and/or process conditions, and user input devices such as pointing devices, keyboards, touch screens, microphones, etc.

The computer program code for controlling the above operations can be written in any conventional computer readable programming language: for example, assembly language, C, C++, Pascal, Fortran, or others. Compiled object code or script is executed by the processor to perform the tasks identified in the program.

Signals for monitoring the process may be provided by analog and/or digital input connections of the system controller. The signals for controlling the process are output on the analog and digital output connections of the apparatus 400.

The system software may be designed or configured in many different ways. For example, various chamber component subroutines or control objects may be written to control operation of the chamber components necessary to carry out the deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

The apparatus/process described herein above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Applications

The present disclosure may be further understood by reference to the following applications for high-quality doped or undoped silicon carbide films, in which the applications are intended to be purely exemplary. The present disclosure is not limited in scope by the specified applications, which are simply illustrations of aspects of the disclosure. Various modifications of the present disclosure in addition to those described herein will become apparent to those of ordinary skill in the art from the foregoing description. Moreover, such modifications fall within the scope of the appended claims.

In some embodiments, a silicon carbide film, such as an oxygen doped silicon carbide film, may be deposited over exposed metal, such as copper. In some instances, the exposed copper surface may be pre-cleaned to reduce copper oxides prior to depositing the oxygen doped silicon carbide film. In depositing the oxygen doped silicon carbide film, reaction conditions adjacent to the substrate can be free of oxidants, such as $O_2$, $O_3$, and $CO_2$, including radicals thereof. Thus, the oxygen doped silicon carbide film may be deposited directly over the exposed copper without oxidizing copper (e.g., creating cupric oxide). Such films can serve as etch stop layers, which can also serve as copper diffusion barriers. The presence of the oxygen doped silicon carbide film can provide a sufficiently low dielectric constant with excellent leakage properties to serve as a diffusion barrier. The oxygen doped silicon carbide film can be an etch stop and/or diffusion barrier either by itself or as a bilayer stack, e.g., SiOC/SiNC bilayer deposited over exposed copper. As discussed earlier herein, SiNC may be deposited as an adhesion layer over the exposed copper, and then SiOC may be subsequently deposited by adjusting the precursors and/or flow rates. In some embodiments, the oxygen doped silicon carbide film can be placed in between adjacent metallization layers that are typically produced by a damascene process. The oxygen doped silicon carbide film can resist etching and can be sufficiently dense to minimize the diffusion of copper ions into adjacent regions of dielectric material. In some embodiments, the precursor employed for the oxygen doped silicon carbide film can be non-cyclic. Non-cyclic precursors can include PMDSO, TMDSO, DEMS, or DMES. The non-cyclic precursor can provide a sufficiently high density to serve as a hermetic or diffusion barrier. In some embodiments, nitrogen may be incorporated into the film by flowing nitrogen-containing precursors.

In some embodiments, a silicon carbide film may be deposited as vertical structures adjacent to metal or semiconductor structures. Deposition of silicon carbide films provides excellent step coverage along sidewalls of the metal or semiconductor structures to create the vertical structures. In certain embodiments, the vertical structures may be referred to as spacers or liners. FIG. 2C illustrates a cross-section of silicon carbide deposited on the sidewalls of a gate electrode structure of a transistor. As illustrated in FIG. 2C, the transistor can be a CMOS transistor with a silicon substrate 210 having a source 212 and a drain 213. A gate dielectric 214 can be deposited over the silicon substrate 210, and a gate electrode 215 can be deposited over the gate dielectric 214 to form the transistor. Silicon carbide liners 211 can be deposited on the sidewalls of the gate electrode 215 and the gate dielectric 214.

In another example, FIG. 2D illustrates a cross-section of silicon carbide deposited on sidewalls of exposed copper lines in an air gap type metallization layer. Air gaps 220 can be introduced into an integrated circuit layer between copper lines 222 that can reduce the effective k-value of the layer. Silicon carbide liners 221 can be deposited on the sidewalls of the copper lines 222, and a nonconformal dielectric layer 223 can be deposited over the air gaps 220, liners 221, and copper lines 222. Examples of such air gap type metallization layers can be described in U.S. Patent Publication No. 2004/0232552 to Fei Wang et al., which is herein incorporated by reference in its entirety for all purposes.

In some embodiments, a silicon carbide film may be deposited on the sidewalls of patterned porous dielectric materials. Ultra low-k dielectric materials can be made from a porous structure. The pores in such materials can provide areas for ingress of metal during deposition of subsequent layers, including the deposition of diffusion barriers containing a metal such as tantalum (Ta). If too much metal migrates into the dielectric material, the dielectric material may provide a short circuit between adjacent copper metallization lines. FIG. 2E illustrates a cross-section of a silicon carbide film as a pore sealant for porous dielectric materials. A porous dielectric layer 232 can have a plurality of trenches or vias cut into the porous dielectric layer 232 to form pores 230. A silicon carbide film 231 can be deposited along the pores 230 to effectively seal the pores 230. Sealing the pores 230 with the silicon carbide film 231 can avoid damaging the porous dielectric layer 232 that may otherwise be incurred by other sealing techniques using a plasma. The silicon carbide film 231 can be sufficiently dense as a pore sealant and may include non-cyclic organo-silicon precursors, such as PMDSO and TMDSO. In some embodiments, an etched dielectric material such as the porous dielectric layer 232 may first be treated by a "k-recovery" process, which exposes the porous dielectric layer 232 to UV radiation and a reducing agent. This recovery process is further described in commonly owned U.S. Patent Publication No. 2011/0111533 to Varadarajan et al., which is incorporated by reference herein in its entirety for all purposes. In another "k-recovery" process, the porous dielectric layer 232 can be exposed to UV radiation and a chemical silylating agent. This recovery process is further described in commonly owned U.S. Patent Publication No. 2011/0117678 to Varadarajan et al., which is incorporated by reference herein in its entirety for all purposes. After exposing the pores 230 to the recovery treatment, which makes the surface more hydrophilic and provides a monolayer of material, a layer of silicon carbide 231 can be conformally deposited to effectively seal the pores of the porous dielectric layer 232.

In some embodiments, a silicon carbide film may be deposited as an ultra low-k dielectric material itself. Ultra low-k dielectrics are conventionally defined as those materials that have a dielectric constant lower than that of 2.5. In such configurations, the ultra low-k dielectric material of silicon carbide can be a porous dielectric layer. The pores of the dielectric layer can be introduced by using cyclic or caged precursor molecules, including the cyclic siloxanes and silsesquioxanes. In one example, the porosity of the ultra low-k dielectric layer of silicon carbide can be between about 20% and 50%. Further, the ultra low-k dielectric layer can have an average pore size of less than about 100 Å, such as between about 5 Å and 20 Å. For example, a cyclosiloxane ring can have a radius of about 6.7 Å. While increasing the number and size of the pores can lower the dielectric constant, the mechanical integrity of the dielectric layer can be compromised if it is too porous.

In some embodiments, a doped or undoped silicon carbide film may provide encapsulation for various memory device applications. In magneto-resistive random access memory (MRAM) applications, the silicon carbide film may be used as a hardmask and/or with a hardmask to protect various layers of the MRAM device, including pinning layers, conductive lines, soft layers, etc. The silicon carbide film may have low etch rates and protect sidewalls and top surfaces of underlying layers, such as metal layers, during etch. Furthermore, the silicon carbide film may be used for protective encapsulation during and after patterning of magnetic tunnel junction (MJT) stacks.

In resistive random access memory (RRAM) applications, the silicon carbide film may encapsulate and protect one or more underlying layers of an RRAM device. When a gap between two electrodes in a RRAM device is being filled with oxide, the silicon carbide film may provide protection against oxidation of underlying films. In addition, an SiCN film or SiC film with a low energy band gap may be used to replace a tunnel oxide in a NAND or switching layer in a RRAM device.

While the silicon carbide film may serve to protect underlying layers or serve to replace switching layers in memory device applications, the functional aspects of the silicon carbide film is not limited to only memory device applications. More generally, the silicon carbide film may also be utilized as etch stop liners and hardmasks in several other device applications because of its high quality, high conformality, low wet etch rate, and low dry etch rate, among other properties.

Although the foregoing has been described in some detail for purposes of clarity and understanding, it will be apparent that certain changes and modifications may be practiced within the scope of the appended claims. It should be noted that there are many alternative ways of implementing the processes, systems, and apparatus described. Accordingly, the described embodiments are to be considered as illustrative and not restrictive.

What is claimed is:

1. An apparatus (400) for depositing a silicon-carbon-containing film onto a substrate (430), the apparatus (400) comprising:
   a reaction chamber (410) including a pedestal (435) for supporting the substrate (430);
   a precursor gas delivery source (450) configured to provide at least first and second organo-silicon precursors through one or more first gas inlets (455) into the reaction chamber (410);
   a plasma source (460) separate from the reaction chamber (410) and configured to generate radicals; and
   a second gas inlet (465) for introducing the radicals from the plasma source (460) into the reaction chamber (410); and
   a controller (440) configured with instructions to perform the following operations:
      flow first and second organo-silicon precursors through the one or more first gas inlets (455) into the reaction chamber (410), wherein each of the first and second organo-silicon precursors comprises one or both of a silicon-silicon (Si—Si) bond and a silicon-hydrogen (Si —H) bond, wherein the second organo-silicon precursor further comprises one or both of a silicon-oxygen (Si—O) bond and a silicon-nitrogen (Si—N) bond;
      generate the radicals from a source gas in the plasma source (460), wherein the source gas is selected from a group consisting of: hydrogen, ammonia, and amine; and
      introduce the radicals through the second gas inlet (465) into the reaction chamber (410), wherein the radicals react with the first and second organo-silicon precursors to deposit the silicon-carbon-containing film on the substrate (430), wherein a composition of the silicon-carbon-containing film is based at least in part on a chemistry of the second organo-silicon precursor.

2. The apparatus of claim 1, wherein the composition of the silicon-carbon-containing film is based at least in part on a flow rate of the second organo-silicon precursor relative to the first organo-silicon precursor.

3. The apparatus of claim 1, wherein the controller (440) is further configured with instructions to perform the following operation:
   vary a ratio of flow rates between the first organo-silicon precursor and the second organo-silicon precursor over time during deposition of the silicon-carbon-containing film, thereby tuning the composition of the silicon-carbon-containing film.

4. The apparatus of claim 3, wherein the composition of the silicon-carbon-containing film is graded so that relative atomic concentrations of silicon, carbon, nitrogen, and oxygen at an upper surface of the silicon-carbon-containing film are different than at a lower surface of the silicon-carbon-containing film.

5. The apparatus of claim 1, wherein the controller (440) is further configured with instructions to perform the following operation:
   flow a third organo-silicon precursor through the one or more first gas inlets (455) into the reaction chamber (410) in place of the second organo-silicon precursor for a duration and modify the composition of the silicon-carbon-containing film.

6. The apparatus of claim 1, wherein an effective dielectric constant of the silicon-carbon-containing film is between 8.5 and 2.5.

7. The apparatus of claim 1, wherein an effective dielectric constant of the silicon-carbon-containing film is less than 2.5.

8. The apparatus of claim 1, wherein the controller (440) configured with instructions to introduce the first and second organo-silicon precursors into the reaction chamber (410) is configured with instructions to flow the second organo-silicon precursor simultaneously together with the first organo-silicon precursor towards the substrate (430).

9. The apparatus of claim 1, wherein the controller (440) is configured to flow the second organo-silicon precursor sequentially with the first organo-silicon precursor towards the substrate (430).

10. The apparatus of claim 1, wherein the source gas is hydrogen gas, and wherein the radicals comprise hydrogen radicals.

11. The apparatus of claim 10, wherein the controller (440) configured with instructions to introduce the radicals into the reaction chamber (410) is configured with instructions to cause the hydrogen radicals to be in a ground state in an environment adjacent to the substrate (430) and cause the environment adjacent to the substrate (430) to be free or substantially free of ions and ultraviolet (UV) radiation.

12. The apparatus of claim 10, wherein the controller (440) configured with instructions to introduce the radicals into the reaction chamber (410) is configured with instructions to cause the hydrogen radicals to have sufficient energy to break Si—H bonds and Si—Si bonds but preserve at least one of Si—O, Si—C, or Si—N bonds in the first and second organo-silicon precursors.

13. The apparatus of claim 1, wherein the controller (440) configured with instructions to introduce the radicals into the reaction chamber (410) is configured with instructions to cause the apparatus (400) to deposit the silicon-carbon-containing film over exposed metal on the substrate (430) without oxidizing the exposed metal.

14. The apparatus of claim 1, wherein the controller (440) configured with instructions to introduce the radicals into the reaction chamber (410) is configured with instructions to control the composition of the silicon-carbon-containing film to obtain a desired wet or dry etch rate.

15. The apparatus of claim 1, wherein the controller (440) configured with instructions to introduce the radicals into the reaction chamber (410) is configured with instructions to control the composition of the silicon-carbon-containing film to obtain a desired density.

16. The apparatus of claim 1, wherein at least one of the first or the second organo-silicon precursor comprises a siloxane, wherein the siloxane comprises pentamethyldisiloxane (PMDSO) or tetramethyldisiloxane (TMDSO).

17. The apparatus of claim 1, wherein the controller (440) configured with instructions to introduce the radicals into the reaction chamber (410) is configured with instructions to deposit the silicon-carbon-containing film at a temperature between 50° C. and 500° C. and at a pressure between 0.5 Torr and 10 Torr.

18. An apparatus (400) for depositing a silicon-carbon-containing film onto a substrate (430), the apparatus (400) comprising:
a reaction chamber (410) including a pedestal (435) for supporting the substrate (430);
a precursor gas delivery source (450) configured to provide at least first and second precursors through one or more first gas inlets (455) into the reaction chamber (410);
a plasma source (460) separate from the reaction chamber (410) and configured to generate radicals; and
a second gas inlet (465) for introducing the radicals from the plasma source (460) into the reaction chamber (410); and
a controller (440) configured with instructions to perform the following operations:
flow first and second precursors through the one or more first gas inlets (455) into the reaction chamber (410), wherein the first precursor comprises one or both of a silicon-silicon (Si—Si) bond and a silicon-hydrogen (Si—H) bond, wherein the second precursor has a chemistry that is different than the first precursor;
generate the radicals from a source gas in the plasma source (460), wherein the source gas is selected from a group consisting of: hydrogen, ammonia, and amine;
introduce the radicals through the second gas inlet (465) into the reaction chamber (410), wherein the radicals react with the first and second precursors to deposit the silicon-carbon-containing film on the substrate (430); and
vary a ratio of flow rates between the first precursor and the second precursor over time, thereby tuning a composition of the silicon-carbon-containing film across a thickness of the silicon-carbon-containing film.

19. The apparatus of claim 18, wherein the second precursor comprises a silicon-carbon (Si—C) bond and one or both of a silicon-silicon (Si—Si) bond and a silicon-hydrogen (Si—H) bond.

20. The apparatus of claim 19, wherein the second precursor further comprises one or both of a silicon-oxygen (Si—O) bond or a silicon-nitrogen (Si—N) bond.

21. The apparatus of claim 18, wherein the silicon-carbon-containing film has a varying concentration of oxygen and nitrogen between an upper surface and a lower surface of the silicon-carbon-containing film.

22. The apparatus of claim 18, wherein the plasma source (460) is configured to generate hydrogen radicals from a capacitively coupled plasma in the plasma source (460).

23. The apparatus of claim 18, wherein the controller (440) configured with instructions to introduce the radicals into the reaction chamber (410) is configured with instructions to control the composition of the silicon-carbon-containing film to obtain a desired wet or dry etch rate.

24. The apparatus of claim 18, wherein the controller (440) configured with instructions to introduce the radicals into the reaction chamber (410) is configured with instructions to control the composition of the silicon-carbon-containing film to obtain a desired density.

25. The apparatus of claim 18, wherein the controller (440) configured with instructions to introduce the radicals into the reaction chamber (410) is configured with instructions to obtain a porosity of the silicon-carbon-containing film to be between about 20% and about 50%.

26. The apparatus of claim 18, wherein the silicon-carbon-containing film is a hermetic or diffusion barrier.

27. The apparatus of claim 18, wherein the controller (440) configured with instructions to introduce the radicals into the reaction chamber (410) is configured with instructions to cause the radicals to react with the first and second precursors in an environment adjacent to the substrate (430) that is free or substantially free of ions and ultraviolet (UV) radiation.

* * * * *